(12) United States Patent
Potofeew et al.

(10) Patent No.: US 9,355,880 B2
(45) Date of Patent: May 31, 2016

(54) METHOD AND APPARATUS FOR THE TRANSPORTING OF OBJECTS

(75) Inventors: Vitalij Potofeew, Villingen-Schwenningen (DE); Dirk Bareis, Donaueschingen (DE); Konrad Kaltenbach, Furtwangen (DE); Franck Delahaye, Vorstatettan (DE)

(73) Assignee: RENA GMBH, Gutenbach (DE)

( * ) Notice: Subject to any disclaimer, the term of this patent is extended or adjusted under 35 U.S.C. 154(b) by 1046 days.

(21) Appl. No.: 12/999,061

(22) PCT Filed: Jun. 19, 2009

(86) PCT No.: PCT/EP2009/004461
§ 371 (c)(1),
(2), (4) Date: Dec. 14, 2010

(87) PCT Pub. No.: WO2009/153061
PCT Pub. Date: Dec. 23, 2009

(65) Prior Publication Data
US 2011/0097160 A1    Apr. 28, 2011

(30) Foreign Application Priority Data
Jun. 19, 2008   (DE) .......................... 10 2008 028 848

(51) Int. Cl.
*B65G 53/00*   (2006.01)
*H01L 21/677*  (2006.01)

(52) U.S. Cl.
CPC ............................... *H01L 21/67784* (2013.01)

(58) Field of Classification Search
CPC ...................................................... B65G 51/01
USPC .............. 406/88, 89; 414/676; 271/195, 3.23; 65/182.2
See application file for complete search history.

(56) References Cited

U.S. PATENT DOCUMENTS

| | | | |
|---|---|---|---|
| 3,761,002 A | 9/1973 | Baumann et al. | |
| 3,870,460 A | 3/1975 | Flint | |
| 4,395,165 A * | 7/1983 | DeRobertis et al. | 406/88 |
| 4,681,776 A | 7/1987 | Bok | |
| 4,722,276 A * | 2/1988 | Tyler | 101/419 |
| 4,874,273 A | 10/1989 | Takisue et al. | |

(Continued)

FOREIGN PATENT DOCUMENTS

| | | |
|---|---|---|
| DE | 4039313 A1 | 8/1991 |
| DE | 69304917 T2 | 2/1994 |

(Continued)

*Primary Examiner* — Joseph Dillon, Jr.
(74) *Attorney, Agent, or Firm* — Wagenknecht IP Law Group PC

(57) ABSTRACT

The present invention relates to methods and apparatuses for the transporting of substantially flat, freely movable objects, wherein at least the holding and guiding takes place by use of a streaming liquid.

The apparatus according to the invention comprises at least one treatment surface with at least one inflow region with a multitude of pass-through openings, at least one discharge region for discharging the liquid after provision of the inflow, but no non-fluidic edges, limiters, or other mechanical guiding aids for guiding the flat object.

A transport device which bases on the invention can preferably be used within and between treatment plants for flat objects or substrates. Further; a preferably wet chemical treatment can take place simultaneously to the transport, provided that the transport liquid has according characteristics or involves according substances or active agents, respectively.

15 Claims, 14 Drawing Sheets

(56) References Cited

U.S. PATENT DOCUMENTS

| | | | |
|---|---|---|---|
| 5,213,451 A * | 5/1993 | Frank | H05K 13/0061 406/72 |
| 5,902,366 A * | 5/1999 | Schnabel et al. | 65/17.1 |
| 6,053,668 A * | 4/2000 | Gorman | H01L 21/67784 406/86 |
| 6,192,711 B1 * | 2/2001 | Lisec | 65/182.2 |
| 6,264,404 B1 * | 7/2001 | Hessburg et al. | 406/108 |
| 6,336,775 B1 * | 1/2002 | Morita et al. | 406/88 |
| 6,354,789 B2 * | 3/2002 | Takeuchi et al. | 414/676 |
| 6,655,878 B1 * | 12/2003 | de Vos et al. | 406/77 |
| 6,676,365 B2 * | 1/2004 | Adam et al. | 406/83 |
| 7,165,918 B2 * | 1/2007 | Kruse | 406/93 |
| 7,731,186 B2 * | 6/2010 | Krause et al. | 271/193 |
| 7,740,240 B2 * | 6/2010 | Iwakiri | 271/97 |
| 9,004,262 B2 * | 4/2015 | Mader | B65G 21/209 198/493 |
| 2005/0011229 A1 * | 1/2005 | Lisec | B65G 49/061 65/182.2 |
| 2005/0042070 A1 * | 2/2005 | Ikehata et al. | 414/676 |
| 2011/0268511 A1 * | 11/2011 | Iida | 406/88 |
| 2012/0031147 A1 * | 2/2012 | Arai et al. | 65/182.2 |
| 2012/0213599 A1 * | 8/2012 | Inazawa | B65H 23/24 406/88 |

FOREIGN PATENT DOCUMENTS

| | | |
|---|---|---|
| DE | 69306581 T2 | 2/1994 |
| EP | 0408021 B1 | 10/1993 |
| EP | 1350830 A1 | 8/2003 |
| GB | 1268913 | 3/1972 |

\* cited by examiner

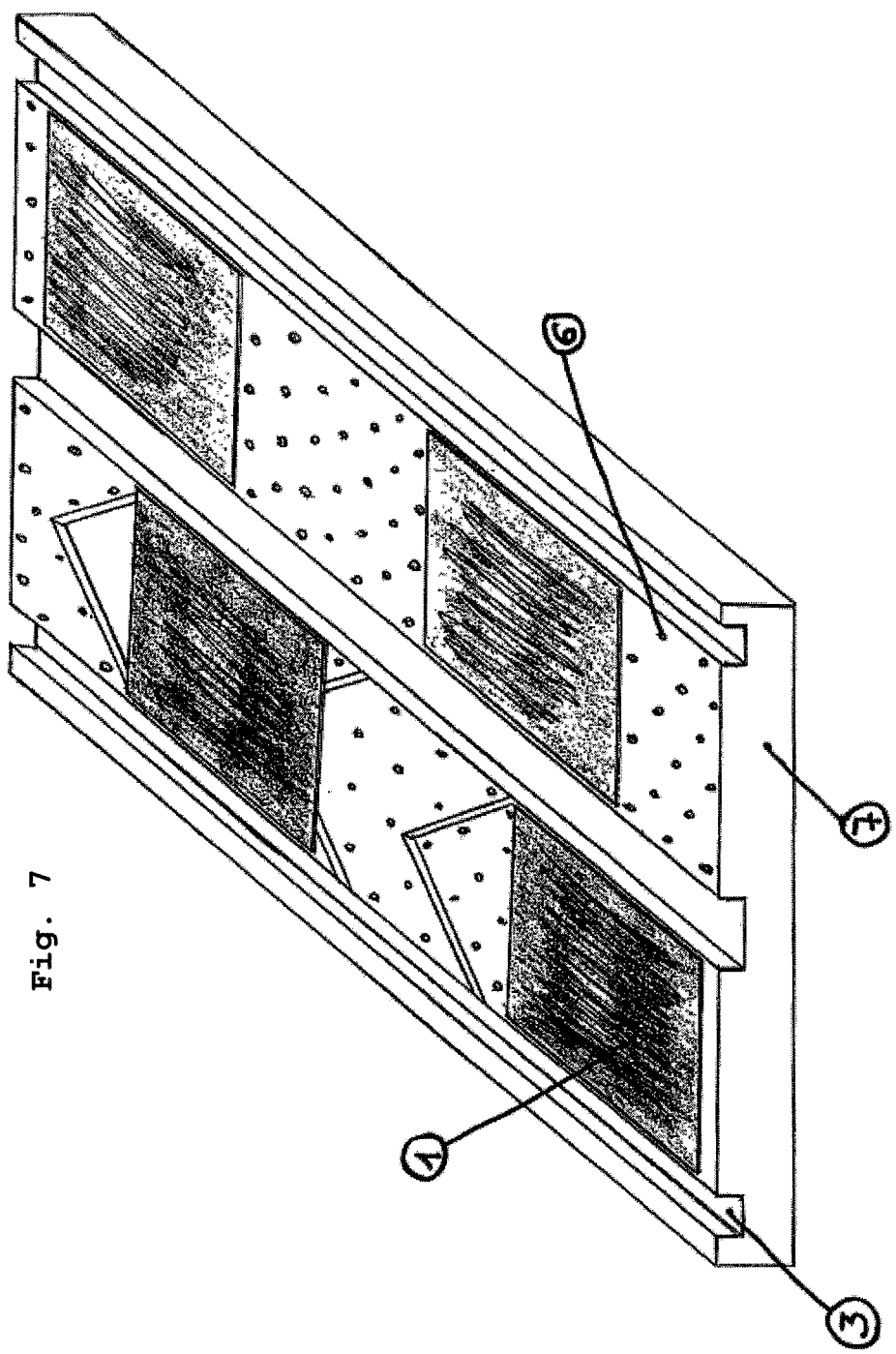

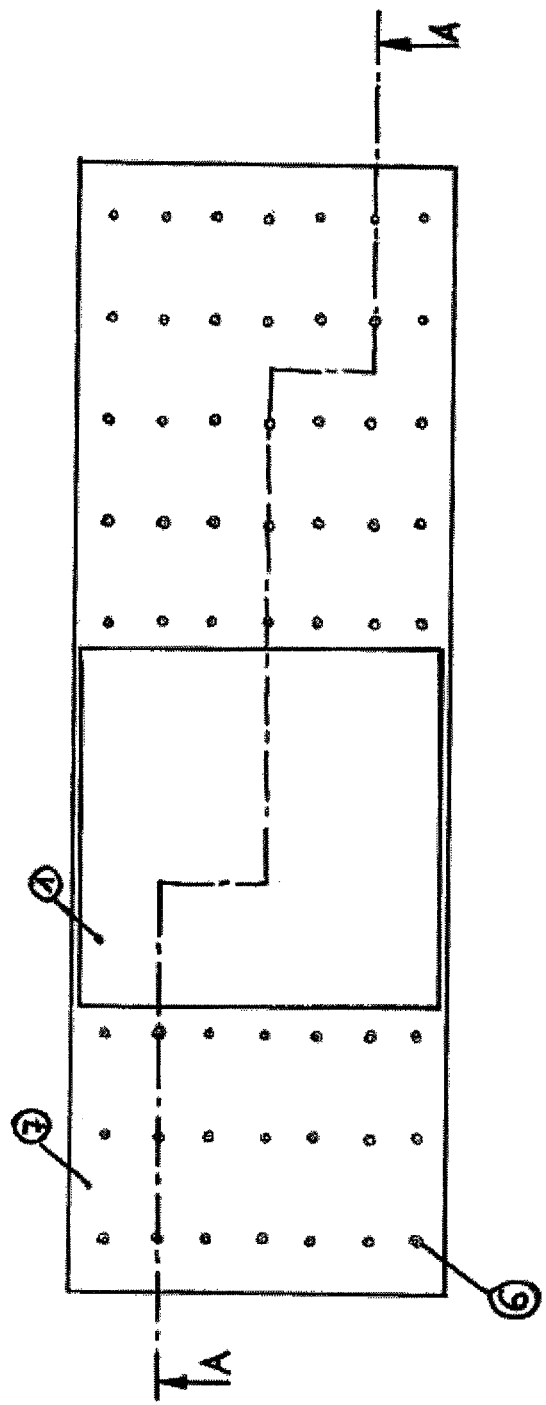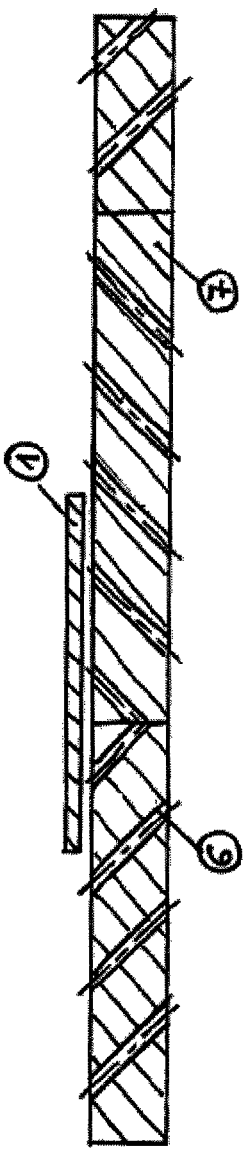

METHOD AND APPARATUS FOR THE TRANSPORTING OF OBJECTS

CROSS REFERENCE TO RELATED APPLICATIONS

This is a national phase entry under 35 U.S.C. §371 of international patent application serial number PCT/EP2009/004461, which claims priority to German patent application serial number DE 10 2008 028 848.9, filed Jun. 19, 2008; the contents of which are herein incorporated by reference in their entirety.

The present invention relates to methods and apparatuses for the transporting of substantially flat objects, wherein the transporting takes place by the use of a streaming liquid. The invention further relates to methods and apparatuses for the transporting of such objects, as well as to the simultaneous wet chemical treatment of the same.

Firstly, several terms which are important for understanding the present invention but which do not have a definite meaning in colloquial language are being defined in the context of the invention.

The "transporting" of a flat object comprises the local change of the position of the object to be transported as well as the simple maintaining of this position without any simultaneous movement of the object, subsequently being referred to as "carrying".

Therefore, "carrying" or "holding", respectively, means that the flat object substantially stands still, i.e. no transport velocity is present in any direction. The apparatus provides the (carrying-)force which is necessary for the holding.

The object must be exposed to a "feed" in order to be moved in the desired direction, so that an according feed force is being exerted onto the object.

In order for the object to maintain a pre-determined course or track during the feed it must additionally be "guided", which is why a guiding force acts onto the object. The guiding force which is provided for the "guiding" is to be differentiated from the feed force which is necessary for the transport motion.

Hereinbelow, the term "transporting" will be collectively used instead of "holding, pushing forward, and/or guiding".

"Mechanically acting" means that the transfer of the aforementioned forces takes place by mechanical means. This includes all non-fluidic methods, such as e.g. means made from plastics or metal, but also those made from very soft, e.g. gel like substances. Not included are, however, liquids and gaseous media.

A flat object is "freely movable" when it is not being carried, held, or guided by mechanically acting means.

From the state of the art, e.g. grippers, supports, cassettes etc. are well known for the holding of flat objects (hereinbelow also being referred to as substrates or briefly as objects). Amongst others, a holding of flat objects is necessary when these objects are being subjected to a stationary treatment. The fact that the substrate must be mechanically contacted in order to support it against gravity and/or to center it, i.e. to hold it in a desired position, is a particular disadvantage of the known apparatuses. This contacting can typically relate to the underside of a substrate, provided that it is being deposited on supports. Alternatively or additionally, this contacting can include the substrate edge(s), since usually, lateral breakout of the substrate must be avoided. This is e.g. also the case when the substrate is being lifted from below by the streaming treatment liquid so that it floats on a liquid cushion, and therefore must not continuously be deposited onto (mechanically acting) supports. Furthermore, it is also disadvantageous if capillary forces build up between the supports and the good during holding, since such a capillary gap naturally lessens without additional spacers until a mechanic contacting of the supports establishes.

The gentle guiding of flat objects is of interest in the context of transport devices as they are preferably being used for the transport of substrates within and between treatment plants. Further, a preferably wet chemical treatment can take place simultaneously to the transport, provided that the liquid being used has appropriate characteristics or includes according substances or active agents, respectively.

In each of the described cases it is necessary that the applied transport devices transport the substrates as gently as possible from one treatment plant to the next, or within one plant e.g. into a treatment liquid and out of it again, respectively. The transport device must be designed such that the regions to be processed (e.g. one side of the substrate) stay clear and are not covered at any time during the transport. During the transport it must be ensured at any time that the objects follow a pre-determined transport track.

In particular in the case of a processing which goes beyond a mere transport, the substrates must very often be brought into contact with the transport and/or treatment liquid, e.g. with a cleaning or etching solution or a coating liquid, during a defined period of time. During the transport, the treatment duration has an essential influence on the result. In particular, the following two methods are being provided by the state of the art in order to meet the desired treatment duration. According to a first method, the substrate is substantially standing still during treatment. The treatment duration is being given by the duration during which the transport device leaves the substrate within the treatment liquid (bath device). According to a second method, the substrate is substantially being further transported during treatment, for example by means of a transport along the surface of the treatment liquid which is present in a basin having a certain length (in-line plant, in-line method). For this, downholders are often being used that shall avoid floating of the often thin substrates. Mostly, the in-line method is preferred in regard of high throughputs.

A mixing or an exchange of the treatment liquid which is mostly necessary for the treatment can be achieved in bath plants by an intermitting relative motion of the substrate(s) in the bath, or for example by means of nozzles and the like. In in-line plants, the presence of a relative motion between substrate and treatment liquid is inherent in the system; a further going exchange of consumed liquid can take place by nozzles, or via weirs or the same.

During the transport of the substrate, be it by means of chains, rolls, rollers, workpiece carriers or grippers, however, a number of problems arises. These are often linked to a possible loss of track of the substrates as well as to the mechanical loads during transport.

Reasons for a loss of track of the substrates to be transported can be e.g. mechanical vibrations as well as temperature variations which can lead to a distortion in the transport devices. A further reason is the mostly low mass of the substrates which results in a friction force that is insufficient for a secure transfer of the feed forces. Firstly, the loss of track results in the danger of collisions with further substrates during transport, or with (lateral) guides which are also usually present in such plants and which shall avoid breaking out of the substrates from the desired track. Additionally, picking up of the transport goods for a further processing step or a relocation is being complicated, so that the same might possibly not take place automatically.

Apparatuses for the guiding or transporting, respectively, of flat substrates are well-known in the art, although the disclosed solutions always provide a mechanical contact between the good to be transported and the transport device with regard to the carrying and/or guiding.

A transport device having the already above mentioned downholders is for example disclosed in EP 1 354 830 B1. Herein, the treatment duration is determined by the (precisely adjustable) transport velocity of the substrate, and by the length of the basin which contains the treatment liquid. However, the substrates are held by mechanical means which results in the aforementioned problems. Further drawbacks of the disclosed and similar plants arise from shafts whose drives are usually arranged outside the treatment basin. The seals which are necessary due to the shafts protruding through the basin wall are particularly prone to wear because of the high aggressiveness of the treatment media such as e.g. HF or HCl. Also, the often long shafts do slightly deflect, which results in inaccuracies during the transport of the substrate.

A further apparatus for the transport of fragile, flat substrates is disclosed in document EP 1 350 830 A1 "Transport rolls, downholders, and transport system". The disclosed transport rolls have a very low susceptibility with regard to temperature variations due to their design and material selection, and allow for a gentle transport of the flat substrates. In addition to the (mechanically acting) rolls on which the good to be transported rests, this invention, however, further discloses so-called track keepers. These are in particular during loss of track in lateral contact with the flat substrates, what is however not desired due to the resulting mechanical exposure.

A further apparatus for the particular gentle transport of flat substrates is disclosed in document DE 40 39 313 A1. Herein, the transport takes place via a streaming liquid film which streams along the surface which is designed as a transport surface, thus carrying and pushing forward the substrates. For the generation of this liquid film the transport surface provides inclined gaps through which liquid flows bottom-up, and thus, against the substrate's underside. A motion direction is being given by the gap's inclination in transport direction. In order to ensure that the substrates to be transported remain on the transport device and do not laterally break out, the apparatus has lateral edges as guides along both sides of the transport surface. Upon a collision with the guides, a counteracting guiding force acts onto the substrates, such that the substrate is being guided on the transport surface even if it should laterally drift away. However, as already mentioned, the presence of lateral, mechanically acting limiters is not desired. Furthermore, it is only possible to a very limited extent to adjust and maintain the transport velocity by means of changing the pressure of the emitting transport medium and/or the angle of inclination of the gaps. The transport velocity which is firstly present is being slowed down by the unforeseeable incidental colliding with the guides, which results in an accordingly imprecise duration of the transport and, in the case of a simultaneous e.g. wet chemical treatment, in a non-uniform treatment result. The angle of inclination which influences the transport velocity is being determined by design during the construction of the plant and cannot be varied afterwards, e.g. depending on the actual transport situation. Also, a temporary stopping of the substrate during the transport is not possible, since the substrate's underside would come into a mechanically acting, physical contact with the bottom plate due to the accompanying lack of the transport medium, which is undesired. Because of that, the disclosed transport device is exclusively provided for the transport, and not also for the processing of the substrates.

An apparatus which is also based on an emitted media stream as a transport means is eventually disclosed in document DE 693 065 81 T2, according to which, however, the objects to be transported, as in particular flexible bands, are streamed against by gaseous fluids and thus lifted as well as optionally moved by means of a fluid stream pointing in transport direction.

The document DE 693 049 17 T2 also discloses such a system which allows the transport of objects without contacting the same mechanically, on the basis of specially shaped exit openings that are arranged substantially perpendicular to the transport plane. However, the document is limited to the mechanical contact with the transport plane because according end-stops are provided for the lateral guiding of the objects. The apparatus provides a differential pressure in order to be able to transport the objects in an orientation other than horizontal. This results in that the object to be transported is pushed in direction towards the transport surface, however, without mechanically touching it, since at the same time, it floats on an air cushion which is being generated by means of according exit openings arranged in the transport surface. The differential pressure can not also be used for guiding of the objects since it acts only perpendicular to the surface of the objects. Further, the device is only meant for the transporting of the objects, but not, however, for the "treatment" in the sense of the present application.

The documents U.S. Pat. No. 3,761,002 or EP 0 408 021 B1 allow for an additional rotation. While document U.S. Pat. No. 3,761,002 discloses air cushions, lateral enclosures are necessary according to document EP 0 408 021 B1 in order to avoid a lateral drifting off of the objects to be transported.

Other devices known from the art, wherein solely the uplift of the substrates is achieved by an according inflow that acts from below, generate the force component which is necessary for the forward transport by means of a descent. However, the problem of mechanically acting guides which avoid a lateral breaking out of the substrates is not being solved herein. Also, only an insufficiently precise adjustability of the transport velocity results from the usage of the natural descent. In particular, it is hardly possible to provide certain motion profiles, thus sufficiently precisely maintaining a given treatment duration. Also, a temporary stopping of the substrates to be transported is not possible without further aids.

It is thus object of the invention to provide a method as well as an apparatus for the gentle transport of flat substrates with a controlled, preferably constant velocity, wherein in particular, lateral edges, end-stops or the same as guiding aids can be omitted, so that neither the surfaces nor the edges of the substrates come into contact of any kind with mechanically acting components for guiding. The method and the apparatus shall be suitable for the transport of individual substrates as well as for the transport of several, subsequently and/or adjoiningly positioned substrates. Preferably, a wet chemical processing of the substrates shall also be possible simultaneously to the transport. The residence time in the apparatus shall be precisely adjustable for maintaining a desired treatment duration. It is further preferred to not only be able to convey the substrates in transport direction, but also to stop them temporarily, wherein the substrates do not, or only insignificantly, come in mechanically acting contact with the environment.

The object is solved by the method as suggested in claim 1 as well as by the provision of the apparatus as suggested in claim 6. Accordingly, the holding and guiding which is comprised by the transporting of a substantially flat and freely movable object such as e.g. a substrate takes place on a liquid by use of an apparatus which comprises at least one treatment surface with at least one inflow region, and at least one discharge region, wherein the liquid which is necessary for the transport is emitted from the at least one treatment surface's at least one inflow region in such a manner that it streams against the flat object before it discharges into the at least one discharge region, so that an adhesion force providing film of liquid is being formed between the treatment surface and the flat object by which the object can be held and track-adherently guided on the treatment surface without lateral edges, limiters or end-stops etc. as mechanical guiding aids.

According to a preferred embodiment, mechanical means are being used for the feed or for the support of the feed which occurs due to the liquid stream, respectively, of the at least one flat object, which are movable in transport direction or which can be stopped, and which in particular serve for a precise control of the feed velocity as well as optionally for the maintaining of a desired stopping time for the carrying out of an e.g. wet chemical treatment. According to the invention, the lateral guiding of the substrates is exclusively achieved by an equilibrium of forces which results from forces in particular between the border regions of the treatment surface and the flat object (gravity, uplift, adhesion which is imparted by the liquid film), and from the surface tension of the liquid being used (cohesion).

The method according to the invention as well as the apparatus as being suggested according to the invention are advantageously suitable both in the context of a stationary treatment as well as in the context of a transport of the substrates, optionally with a simultaneous treatment which takes place under a transport velocity. The transport can take place within one as well as between several treatment plants. Further, application of the invention's teaching is of particular advantage in such treatment plants in which objects or substrates must undergo high-purity wet processes by usage of water, in particular of high-purity water, or of liquid chemicals. It is usually important in these applications that the substrate surfaces do not dry at any time, since the surface purity of the substrates could be limited thereby.

Further preferred embodiments are to be taken from the respective depending claims as well as from the following detailed description and the figures.

The present invention is based on the insight that substantially freely moveable flat objects can be held and track-adherently transported on a liquid, such as in particular on a streaming liquid or on a liquid film, without lateral limiters, edges, or other mechanical guiding aids being necessary as constructive components of an according apparatus for the guiding of the objects.

In the context of experiments that were carried out regarding the invention it was surprisingly found that a liquid film which is used for the transporting of substrates and which is formed by a streaming liquid can be provided in such a manner that an automatic holding and guiding of the substantially flat object to be transported takes place on a holding or transporting device.

Since, if desired, a simultaneous treatment can take place in the context of the transport, the unifying term "treatment surface" is being used hereinbelow, wherein a "treatment" according to the invention does also comprise or exclusively relates to a "transport".

An essential aspect of the present invention is the provision of forces which are responsible for the secure holding and in particular for the track-adherent guiding of an object on and along the treatment surface, such as for example the spacing of the object from a treatment surface as well as the maintaining of a pre-determined position or a pre-determined track in the context of a for example basin- or groove-shaped apparatus.

According to a first embodiment, the method according to the invention in the context of the above definitions only serves for the provision of the holding and guiding forces which are necessary for the secure holding and guiding of a flat object.

According to a second embodiment, the method according to the invention additionally serves for the generation of a feed force which is necessary for the feed.

According to both embodiments, the holding and track-adherent guiding exclusively takes place by using a preferably streaming liquid, so that mechanically, i.e. non-fluidically, acting lateral edges, limiters, or other means for holding and guiding the objects can be omitted. In this way, a mechanical damage of in particular the lateral edges of the flat objects can reliably be avoided. Further, the holding and guiding also takes place without mechanically acting limiters, guiding aids, holders or the same, such as for example holding devices, grippers, vacuum chucks, etc., which are arranged above and/or below the flat object. In this way, a mechanical damage of the usually very touch sensitive two-dimensional sides of the objects is largely prevented.

According to the invention, the guiding of the objects is caused by an interaction of two fluids of different types, i.e. a liquid and a gas, wherein the gas is not emitted from the treatment surface but relates to the surrounding ambient air. In this situation, the adhesion which is necessary for the holding and guiding develops between the surfaces of the flat object and the treatment surface. This is for example not the case if the object is not entirely surrounded by one and the same liquid. Here, it is of no importance whether minor amounts of the one type of fluid are contained within the other, for example gas bubbles in a liquid.

According to the invention, the streaming liquid exits from at least one inflow region which is present on at least one treatment surface. The streaming liquid is directed in such a manner that it streams against the flat object. It is possible that the liquid exits substantially perpendicular from the treatment surface and therefore perpendicularly impinges onto the flat object which is arranged parallel to the treatment surface, thus only lifting the object. The thickness of the liquid film preferably ranges between 0.1 and 3 mm. Alternatively, it is possible that the liquid exits under an angle from the treatment surface, so that an additional motion component acts onto the object.

Subsequently, the liquid streams into at least one discharge region. This discharge region can for example be characterized by an overflow edge in the border region of the treatment surface, or also by according discharge openings beyond the treatment surface.

According to the invention, the guiding and holding of the substrate takes place without any contact to mechanical means. Although one or several catches can touch the edge of the substrate for reasons of feed, these catches are no mechanical means for guiding and/or holding the substrate. As long as the substrate is entirely arranged above the treatment surface and is carried by the emitted liquid, it is freely movable. This is the case for example if the substrate is narrower than the width of the treatment surface. When the substrate reaches the discharge region or crosses the border between the treatment surface and this discharge region, according to the invention, an equilibrium of forces develops between the flat object and the at least one discharge region. This equilibrium of forces which is particularly based on the formation of adhesion forces between the surface and the border of the discharge region results in that the flat object automatically, i.e. without interaction with mechanical devices, takes a preferred position which, according to the invention, corresponds to the desired, stationary position, or to the pre-determined position which follows the transport track, respectively. Furthermore, it also automatically returns to this preferred position when it is, for example by means of external application of forces, deviated from this position. Such forces, in particular during transport, can act onto the object and result, without the automatic return motion, in leaving the pre-determined transport track.

It is necessary that the discharge region is dimensioned in such a manner that it is possible to discharge at least that amount of liquid which is being emitted in the inflow region.

The effect according to the invention can alternatively, additionally, or exclusively also be achieved in that nozzles or equally acting means are arranged in the discharge region from which a directed flow exits in such a manner that the level of the liquid in this region is lifted, thereby forming a "liquid weir" which represents a fluidic boundary over which the flat object can glide only under application of significant external influences. A liquid, a gas, or a liquid-gas mixture can be emitted via these nozzles. Emitting can take place continuously or in pulses, so that in the first case, a continuous stream, in the second case, e.g. individual liquid pulses or gas bubbles which are embedded in liquid are being formed which particularly effectively enable the lifting of the level, and which additionally generate a multitude of small waves during breaking up at the liquid surface by which the flat object is pushed from the liquid weir back to the treatment surface. This type of transport is preferably being used if the wetting of the substrate surface is allowed.

Besides a lateral arrangement, such weirs can alternatively or additionally also be arranged perpendicular to the transport direction, and can be used during operation for a stopping of the transported objects. In the simplest case, such weirs are formed by a row of stop-nozzles which substantially emit along the entire width of the treatment surface perpendicular from the same in direction of the substrate surface.

According to a preferred embodiment of the method according to the invention, the liquid which serves for the holding and guiding of the flat object is a treatment liquid. In this way, a treatment of the flat object can simultaneously take place with the holding and guiding. In particular, cleaning, coating, or etching steps are eligible as treatments.

According to a particularly preferred embodiment, the individual forces which cause the equilibrium of forces symmetrically act on the flat object. This means that the inflow and/or the discharge region(s) is/are arranged symmetrically on or to the treatment surface, respectively, and therefore to the object to be held or to be guided. If, for example, the flat object has a quadratic or round shape, it is particularly preferred in the case of holding the same that an also quadratic or round, circumferential, or even regularly interruptedly designed discharge region is provided. In regard of the guiding it is particularly preferred that the apparatus being used comprises two substantially equally designed and opposingly arranged discharge regions lateral to the treatment surface, so that at least one treatment surface with the at least one, preferably also symmetrically arranged inflow region is laterally enclosed by both discharge regions so that it is ensured that the flat object to be guided experiences substantially the same forces at the according edges which point in direction of the discharge regions.

According to another embodiment, the equilibrium of forces does not act symmetrically on the flat object. This can e.g. be the case when the discharge region(s) is/are not symmetrically arranged to the flat object, or when, in case of the guiding (when viewed in feed direction), only an eccentrical discharge region is provided, e.g. one that is unilaterally arranged at one lateral border of an according groove-shaped apparatus. Experiments have demonstrated also in such a case that the equilibrium of forces according to the invention is formed in such a manner that the distance of the flat object to the discharge region remains substantially constant, so that a guiding according to the invention of the object is possible. Optionally, it can be necessary that the exit nozzles in the inflow region of the treatment surface are directed against the overflow edge, so that the substrate is being guided in this desired direction and can not drift away in an uncontrolled manner to the opposing border of the treatment surface where, in this case, no discharge region is present.

According to a preferred embodiment of the method according to the invention it is provided that, in addition to the aforementioned equilibrium of forces, a feed force is exerted onto the flat object for moving the same.

According to a particularly preferred embodiment, the feed force is exerted onto the flat object by the streaming liquid. This feed force is being provided independently from the force which is necessary for the holding or guiding, and is achieved by streaming a liquid in the desired motion direction. Preferably, the same liquid is being used for this as for the holding and guiding. It is particularly preferred that the liquid streams out of the same exit openings of the discharge region(s) as well. Here, the liquid which is set into motion acts as fluidic catch for the respective flat object. The preferred provision of the feed force by means of the directed streaming of liquid represents a particularly effective means for avoiding mechanical damages of the usually fragile flat objects.

Particularly in the case of a provision of the feed by means of the streaming liquid it is further preferred that the delivery into the region of the apparatus according to the invention, and in particular, the handing-over of the substrates to the actual transport device, already takes place with the feed velocity which is provided inside the apparatus according to the invention. In this way, problems regarding the handing-over can largely be avoided. This is of particular advantage if substrates of different weights feed into the apparatus, since the substrates are being differently accelerated under exposure of a respectively equal feed stream. The resulting different velocities can, in the worst case, lead to collisions of subsequent substrates.

In the case of a processing of the substrates in in-line plants, experiments have demonstrated that the treatment result particularly depends on precisely maintaining the treatment duration. The gentle transport alone by means of a transport liquid which simultaneously also was the treatment liquid did usually not yet result in sufficiently precisely maintaining the treatment duration. A simultaneous transporting and processing of substrates while using the same medium was only in certain cases possible if both functions "processing" and "transport" could be separated. Only in this way, the predefining or the maintaining, respectively, of a transport velocity was achieved substantially independent from a base velocity of the substrates which was imposed by the generation of the liquid film.

Therefore, it is provided according to another embodiment of the method according to the invention that the feed force is exclusively or additionally such as supportively being provided by a mechanically acting feed device, wherein this device naturally can also be used as stop or brake unit, provided that a feed which is generated by liquid stream shall be counteracted. This device touches the respective flat object preferably at its edge which points against and/or in feed direction. In the case of round substrates, these parts of the circumferential edge are preferably being contacted which are directly aligned in feed direction, or just against the same, respectively. Preferably, the shape of the parts of the feed device which contact the substrate are adapted to the outer contour of the flat object. In this way, the feed device can achieve a deceleration or an acceleration of the respective object, wherein this takes place substantially independent from an optionally also present feed velocity that is caused by the streaming liquid film. In this way, it is therefore also possible to adjust the residence time in a processing plant independently from a possibly present base stream which is being caused by the streaming liquid.

Particularly preferred feed devices are described in detail in the context of the apparatus according to the invention. For the case of a multi-, such as in particular, a two-part feed device, where the handing-over of the substrate from a first to a subsequent part of the feed device takes place, the according process is represented as subsequently described, wherein the description bases itself exemplarily on the transport along one segment. It is clear that other longitudinal sections can be bridged with such a feed device as well. It is therefore particularly advantageous to use such a feed device within treatment plants, so that analogously, the term "segment" is interchangeable with the term "treatment plant".

Firstly, the substrate is sufficiently far introduced into the entry of a segment, i.e. at least as far until the substrate with its downward-facing side is supported by the fluid layer of the fluid cushion without mechanically contacting the treatment surface. The introduction itself can therefore also be effected by means other than those which are provided according to the invention. However, it is preferred that also upstream of a treatment device which is equipped with the apparatus according to the invention, apparatusses are being used which allow a transport of a substrate according to the invention being exceptionally gentle and controllable. It is further preferred that the delivery velocity is adapted to the desired feed velocity. The introduction has progressed sufficiently far when the taper of the substrate that follows the widest part of the same is at least slightly located in the region of the segment. In other words, for example, the centre of a circular substrate would protrude at least slightly over the border of the segment into the region of the latter. Only then it is possible to further move the substrate into the region of the segment with the feed device according to the invention.

Then, a control of the catches of a first part of the preferably multipart feed device takes place in such a manner that a contact of the preferably rear or in the back region located edge of the substrate is established. As mentioned before, this is only possible if the substrate is sufficiently far introduced into the region of the segment.

Then, the transport of the substrate by means of the catches of the first part of a multipart feed device can take place within the region of the segment. According to the invention, the treatment of the substrate can take place on this path. It is of course also possible to interrupt the transport in order to e.g. enable a longer residence time of the substrate in the region of the segment. However, it is preferred according to the invention that a permanent contact between the catches and the substrate is maintained during the entire time.

Subsequently, a handing-over of the substrate to at least one further part of a preferably multipart feed device can take place. For this, the catches of both parts must be controlled in such a manner that the catch(es) of the first part contact the edge of the substrate until this edge is also contacted by the catch(es) of the further part. Therefore, both the handing-over as well as the taking-over catch(es) contact the substrate at least for a short moment, thus ensuring that an uncontrolled movement of the substrate does not occur at any time. A guiding of the substrate by means of the catches is, however, not necessary, since the aforementioned teaching according to the invention is being used, so that a lateral breaking out of the substrate is being avoided. If more than one respective handing-over and taking-over catch is provided, these are preferably arranged according to the invention with different respective distances to each other in lateral direction, such that a collision of the catches of different parts of the feed device during the handing-over of the substrate is excluded.

After the completed handing-over, the further transport of the substrate within the segment takes place by means of the catch(es) of the further part of the multipart feed device. Of course, a treatment of the substrate can take place during this further transport as well. If desired, a stopping of the feed is possible as well.

Finally, the substrate is sufficiently fed out of the exit of a segment. This feeding out is sufficient when the taper of the substrate that follows the widest part of the same is at least slightly located outside of the region of the segment. Therefore, this step is to be seen in analogy with the aforementioned sufficient feeding in of the substrate into the region of the segment. In the case where a further segment of the type according to the invention follows the segment, it can only take over the substrate if the substrate was, as described before, sufficiently far fed in into the same, which is equivalent to a sufficient feeding out of the substrate from the preceding segment.

According to a further embodiment, it is provided that the catches of a further part of the multipart feed device feed out a first substrate through the exit from the region of a segment, while the catches of a first part of the multipart feed device feed in a second substrate into this region. In this way, several substrates can be fed through the segment simultaneously, thus achieving a further improvement of the productivity. By means of the separate controllability of the parts of the feed device it is also possible to already transport a substrate into the region of a segment while a second substrate temporarily stands still in the region of this segment. In this case it is only necessary to ensure that according catches are available in time for the handing-over of a substrate. This can be achieved by timely feeding out the treated substrate from the region of the segment, or also by providing further or additional parts of the multipart feed device.

According to a particularly preferred embodiment of the method according to the invention, it is provided that at least the transfer velocities and, if applicable, the feed velocities acting on the respective substrates and, if further applicable, the flow velocities of several subsequent segments, are synchronized with each other. In this manner it is ensured that substrates which are fed out from an upstream arranged segment are handed over safely and controlled to the subsequently arranged segment. In particular, it is ensured that no collisions can take place due to piling up substrates, or due to catches being in unfavourable position.

The streaming liquid as provided according to the invention can stream against the flat object optionally single or double sided. In the case of a single sided arrangement, the liquid film is located below the flat object so that the latter is suspended as if on a liquid cushion.

In the case of a double-sided arrangement, the flat object to be held and to be guided is streamed against from both sides by the streaming liquid, wherein the respective treatment surfaces and inflow regions are arranged both below as well as above the object. Accordingly, it is possible to speak of a sandwich like arrangement of the flat object.

It is thus possible that the feed onto the object is being provided by means of the streaming liquid itself, as well as by means of one or several additional feed devices. In the first case, the feed generating stream of the liquid can also be provided by additional, preferably laterally arranged openings such as e.g. nozzles. It is also preferred that for the latter case feed devices which laterally engage with the liquid filled region are provided, wherein alternatively or additionally openings such as in particular longitudinal slots are to be provided in at least one of both treatment surfaces, through which the catches of the feed devices extend and are able to act onto the object without entirely or predominantly having to be arranged there themselves.

According to a further embodiment, the method according to the invention comprises one step for ultra-and/or megasonic treatment of the flat object. This step can take place prior to, during, or after an optionally present motion of the flat object, wherein it is preferred that the ultra or megasonic treatment is being carried out during the motion of the flat object.

The invention further comprises an apparatus for carrying out the method according to the invention.

Accordingly, the invention discloses an apparatus for the transporting of a substantially flat and freely movable object onto a liquid, wherein, according to the invention, several substrates can be transported side by side and/or subsequently as a matter of course as well. The apparatus comprises at least one treatment surface having at least one inflow region with a multitude of pass-through openings out of which the liquid streams against the flat object, and at least one discharge region into which the liquid discharges after provision of the inflow.

According to the invention, the apparatus does not comprise any non-fluidic edges, limiters, or other mechanical guiding aids for guiding the flat object, since the flat object is being held and guided exclusively by the stream of liquid.

In view of the particular design of the apparatus according to the invention, reference is made to the aforementioned statements regarding the description and the carrying out of the method according to the invention.

According to the invention, the at least one inflow region of the at least one treatment surface shall generate a stream of liquid which is directed against the flat object and lifts (in case of a stream from below) the same without mechanically acting means being necessary thereto. For this, the inflow region comprises according pass-through openings; particularly preferred, a multitude of the same. From these pass-through openings, the liquid is being emitted with a certain pressure and with a certain flow velocity. The pass-through openings preferably can have round or rectangular, and particularly preferred gap- or slit-shaped cross-sections. They can be statistically distributed or regularly arranged. For example, the number of pass-through openings can be reduced in regions in which a lower lift or a lower feed is desired. Furthermore, porous materials such as sintered materials are also possible as pass-through openings. For this, metallic as well as preferably those materials which are based on plastics are usable. These provide a particularly large number of statistically distributed pass-through openings with a low cross section, so that nevertheless, in total, a large flow rate can be emitted through the entirety of the pass-through openings. A further advantage of such materials is that the treatment surface must not provide an opposing surface where the pass-through openings start, but that e.g. from the sides liquid can be pressed into the porous block which then distributes inside the porous material before exiting at the treatment surface. Also, the component which comprises the treatment surface does not necessarily consist of several layers which carry the feed channels, but only of a single layer.

The discharge region firstly serves for the reception of the liquid, after the latter has been streamed against the flat object. As already described in the context of the method according to the invention, the discharge region can for example be characterized by means of an overflow edge, or also by means of according discharge openings, which, according to a preferred embodiment, can be arranged partially inside the treatment surface as well. It is particularly important that the discharge region is dimensioned such that it can discharge at least the amount of liquid which is emitted onto the treatment surface, so that an undesired accumulation of liquid can be excluded.

The overflow edge is preferably designed such that it has an edge angle of ≤90° (right angle), wherein smaller angles that result in a more pointed edge are preferred. As a matter of course, the overflow edge can comprise different embodiments of the same, or it can be designed non-continuously.

Further embodiments provide that slots are present in the treatment surface which preferably start in the middle of the treatment surface, and which extend in a top view V-shaped towards the sides of the treatment surface up into the discharge region(s) which is/are arranged laterally to the treatment surface. The cross section of the individual channels can preferably be rectangular. Particularly preferred are several of the slots arranged and spaced parallel to each other. The tip of the "V" can point in as well as against the transport direction. Thus, a particularly fast media exchange is guaranteed, provided that the pass-through openings are located on or in the treatment surface, respectively.

Alternatively or additionally, the slots can also be designed angular, and they can extend over the entire width.

As a matter of course, combinations of the mentioned embodiments of the discharge region are possible within one treatment surface, and also within one inflow region.

In the context of a stationary plant in which the flat object shall be held and guided, but, however, not be moved by feed, the discharge region can preferably be formed by an overflow edge which is designed circumferentially and continuously or non-continuously and which optionally can comprise notches. However, it has to be ensured that during operation of the apparatus according to the invention, a sufficiently high liquid level is achievable at any time so that the object to be held and to be guided does not come into mechanical contact with other components of the apparatus such as, in particular, with the treatment surface. However, it can be provided in this context that the apparatus comprises mechanical centering aids or similarly acting components onto which the object can be disposed prior to the actual treatment, or by which it can be held and guided until the previously described processing according to the invention begins. It is further possible that the object is being disposed by a suitable means onto the already streamed on treatment surface of the apparatus according to the invention, and subsequently is being treated or transported according to the invention.

Also in the case of an additionally desired feed of the flat object, the at least one discharge region can be designed as an overflow edge or weir. Preferably, this region is arranged laterally beside the treatment surface, while the flat object moves in the middle region, i.e between the bilateral borders of the treatment surface, along the desired, pre-determined transport track. Here, an arrangement of one individual, continuously or non-continuously designed discharge region is possible, as well as the arrangement of several, particularly preferred symmetrically arranged, discharge regions.

As already mentioned, the apparatus according to the invention comprises no non-fluidic edges, limiters, or other mechanical guiding aids for holding and guiding of the flat object, and the flat object in the context of the method according to the invention is being held and guided exclusively by the stream of liquid.

In the context of a preferred embodiment by use of an aqueous liquid film as transport means, the liquid is continuously emitted from below as well as optionally additionally from above onto the treatment surface, or it is emitted through the same by means of the pass-through openings, respectively.

By means of the controlled lateral discharging of the liquid which takes place preferably and, in analogy with the emitting of liquid in the inflow region, continuously, an effect establishes between the flat object and the at least one discharge region by which the substrate of the object can not break out laterally and leave the treatment surface. This effect ensures that the object in case of a stationary treatment stays at the pre-determined location, and that, in the case of a motion of the object, the same is guided or follows the pre-determined transport track in the pre-determined transport direction track-adherently on the treatment surface. Thus, the effect generates a force which, when being superimposed with the other forces that act onto the object, results in an equilibrium of forces which guides the object in the desired position. Apart from that, reference is made to the according descriptions in the context of the method according to the invention as set forth above.

According to a preferred embodiment, the inflow region of the apparatus according to the invention as part of the flat treatment surface is formed from a rigid or flexible material. This surface can e.g. be made from plastics, metal, ceramics, wood, stone, and composites, as well as from combinations of the same.

According to one embodiment, the treatment surface can be designed stationary. According to another embodiment, the treatment surface can be designed movable, i.e. it can be lowerable or liftable, or it can be tiltable. In this way, according to the requirements, a situation can be created which is optimally suited to the according task, the substrates dimensions, the substrate mass, etc. Likewise, the stream of the liquid can be influenced by according inclination of the treatment surface. Furthermore, the temporary lowering and lifting of the treatment surface can be used in the context of in-line plants in order to temporarily stop, or to decelerate or accelerate the substrates. Also, a selection of e.g. damaged or broken good can be achieved by means of an accordingly built "two-way transport".

Regarding a substrate with a diameter of 156 mm, it is preferred for a treatment surface of 450 mm length that the amount of consumed, i.e. in and out streaming liquid amounts to 200 l/h. Particularly preferred, the quantity amounts to 400 l/h, since in this way, a good exchange of liquid is given also with regard to a parallel treatment during the transport, and particularly also by using the particularly advantageous, aforementioned V-shaped arrangement of the slots in the discharge region.

An adaption of the positioning of the discharge region which borders the treatment surface to the width of the object is essential for a particularly effective generation of the adhesion effect according to the invention. In the case of an e.g. linearly running treatment surface, the track width of the same must therefore be adapted to the width of the substrates to be transported. If this does not occur, if e.g. the object is significantly narrower than the treatment surface, the object will laterally be freely movable within the boundaries of the width of the treatment surface, what, however, can be advantageous in particular with regard to a simultaneous wet chemical treatment, since in this way, a better exchange of treatment liquid below the substrate's surface to be treated takes place. Just when reaching the border of the treatment surface, the effect according to the invention is formed which avoids a further drifting off of the substrate.

According to a preferred embodiment, the treatment surface is designed such that it is not more than 4 mm wider than the flat object. Preferably, the treatment surface is designed even not more than 3 mm wider. If, however, the treatment surface is narrower than the object, this results within the boundaries of the width of the treatment surface in a laterally free movability of the object, as mentioned above. Then, the effect according to the invention forms just when reaching the border of the treatment surface.

According to a further aspect, the present invention relates to a method for transporting a flat object on the surface of a streaming liquid which is being fed into an overflow container.

Since the liquid from this container flows off due to its construction over at least one overflow edge of the lateral container walls into the at least one discharge region, the positioning effect according to the invention can be advantageously used even in this special application, so that no according mechanical means are necessary for the holding and for the track-adherent guiding of the object on the liquid. The feed which is commonly comprised by the transport is, if desired, exclusively provided by the flow direction of the liquid which is fed into the container, whereby a multitude of suitable means for generation of a desired flow characteristic is available from the art to the one skilled in the art. Alternatively or supportively, the feed force can also be provided by means of at least one feed device according to the invention. Therefore, the effect according to the invention as well as the advantages which are achieved according to the invention can be exploited or provided, respectively, also for a transport of a substantially flat object through a basin which is filled with liquid. The width of the basin perpendicular to the transport direction substantially corresponds to the width of the object to be transported. With regard to further details of the dimensioning of the basin as treatment surface, particular reference is made to the previous paragraph.

Alternatively or additionally to the aforementioned overflow region (overflow edge), the overflow region can consist of boreholes, perforated strips, lattice-like openings or the same, or it can comprise such means over or through which the liquid can also flow off from the treatment surface. Further, the discharge region can also be formed by the discharge holes which border the inflow region. According to the invention, it is important in all cases that the discharge region is not flooded, but that the liquid in these functional regions forms an overflow edge.

According to a preferred embodiment of the apparatus according to the invention, the same comprises an active suction of the liquid from the discharge region. In this way, a sufficient amount of liquid can discharge, particularly in cramped conditions. Further, this amount can be controlled by a variation of the power of the active suction; for example, it can be advantageous to temporarily limit the amount in order to achieve an accumulation, and therefore, a lifting of the liquid level, or, vice versa, to suck off so much liquid such that temporarily no further transport according to the invention of the substrate is possible.

According to a further embodiment in which, in addition to the holding and guiding, a feed must be provided, the apparatus according to the invention comprises according means for the generation of a feed force which acts onto the flat object. These means are always necessary when a (loco-) motion of the object is desired besides or instead of the holding and guiding of the same.

According to a preferred embodiment, the feed is provided by means of the liquid which is streaming out of the pass-through openings of the treatment surface. These openings are preferably designed as holes or slits, and they can be aligned with the transport direction according to a particularly preferred embodiment. Further, holes or slits can be provided which are aligned contrary to the transport direction. Thus, it is clear to the one skilled in the art that the treatment surface as a whole, or also individual regions of the same, can be equipped with holes and/or slits of opposing orientation. It is further provided according to the invention that the holes or slits can be loaded with a liquid stream individually, in groups, or as a whole. Herein, it is particularly preferred that the composition of the groups during the operation is changeable, so that in this way a simple control of the feed force is possible.

It is further preferred that the pass-through openings are designed changeable in their inclination and/or in their cross section. In this way as well, the stream can be purposefully influenced for the manipulation of the objects, or for the adaption to their geometry or mass, or for the desired transport velocity. In addition to an orientation of the pass-through openings which runs perpendicular to the treatment surface, these can preferably also be oriented angularly in such a manner that the emitting liquid has one component in or against the transport direction. Particularly preferred is an angle of inclination of 45°, from which an according feed of the objects results. It is further preferred that the angle of inclination of the boreholes amounts, in direction of the side of the treatment surface, to 30-45°, measured from the vertical.

It can however also be provided that the arrangement of the pass-trough openings is such that the substrate which is moved by means of the liquid stream is set into rotation. For this, the pass-through openings are to be arranged on a circular path, wherein they have an inclination which is tangentially to this circular path. The rotation velocity can be influenced by changing the amount of liquid and/or the angle of inclination.

A stopping or at least decelerating of the substrate can be enforced by arranging and controlling pass-through openings which point contrary to the transport direction. In this way, temporary barriers can be formed which allow for a better control of the residence time of a substrate at a certain position. The substrate is then released by switching off the according pass-through openings, or by swiveling the same in transport direction.

According to a further embodiment, the feed force is additionally or even exclusively being provided by a feed device. This means that the feed force which acts onto the object is not, or at least not exclusively, being provided by means of the streaming and directed liquid. An at least partial decoupling of the feed force from the streaming liquid takes place in this way, which in particular allows for a more precise control of the according transport velocity. This is of vital importance in particular in the context of in-line processing plants, since the treatment result is often influenced by the treatment duration which must therefore be precisely maintained.

It is therefore possible according to the invention that a feed is provided exclusively by means of streaming liquid as well as exclusively by means of additional feed device(s), and also by a combination of both variants.

According to a particularly preferred embodiment the feed device of the apparatus according to the invention comprises a drive means which is selected from the group consisting of drive belts, cams, slide strips, link chains, pneumatic cylinders, and fluid pumps. Further, the feed device comprises at least one feed means which is selected from the group consisting of mechanical end stops, cams, ribs, pins, and scraper floor rails. Preferably, the feed means respectively acts only onto the flat object's edge(s) which stand(s) perpendicular to the transport direction, and in particular onto the rear edge. It is further preferred that the feed means is adapted with its shape to the according edge of the flat object in order to enable the best possible distribution of the feed forces.

It is also possible that the feed device is designed in such a manner that it is drivable in transport direction and optionally additionally stoppable. Thus, other means and devices such as air nozzles which are oriented in or against the transport direction, or other catches which are drivable in transport direction and which are stoppable, can be present alternatively or additionally to the above described feed means, with which the motion of the objects can be decelerated or accelerated. Also in this way, the relative motion between the liquid and the objects to be transported can be adjusted to the requirements at any time.

In the following, several particularly preferred embodiments of a feed device with at least one catch shall be described in detail.

According to a first embodiment, the feed device, including its at least one catch, is arranged above the treatment plane, and the catch(es) is/are designed in such a manner that the edge of the substrate to be treated can be contacted by their respective end(s). In the context of this embodiment, the feed device can be designed as a separate structural component, or as an integral element of an optional further treatment surface being present above the treatment surface for the formation of an upper fluid cushion. Provided that the feed device is designed as a separate structural component, the further treatment surface preferably has gaps for the at least one catch so that the same can permanently contact the substrate edge during its transport through the segment.

According to a second embodiment, the feed device, including its at least one catch, is arranged below the treatment plane as an integral component of the treatment surface for the formation of the lower fluid cushion.

According to a third embodiment, the feed device, including its at least one catch, is arranged parallel to the feed direction and lateral to the treatment plane as an integral component of the lateral wall of a possibly present treatment chamber.

It is clear to the one skilled in the art that these basic embodiments can be combined according to the invention with each other, depending on the actual field of application.

Furthermore, according to the invention, each of the above embodiments can be realized not only with a single, but preferably with two feed devices which most preferably are designed identical.

In the context of the above first embodiment, the feed device is therefore designed as a separate structural component preferably two-part, wherein each part has at least one catch. The multipart design is particularly required or advantageous when several segments are switched one after another and the segments exceed a certain minimum length. A multi-, and in particular, a two-part feed device is also necessary when the next substrate shall be fed into the region of a segment while the previous substrate is still partially located on this segment. The multipart design of the feed device means that it consists of at least two assemblies which substantially fulfil identical tasks, thus having a substantially identical design. The most essential difference between the parts is their positioning in the interior of the segment. Usually, one part of a multipart feed device will be arranged in the entry region of the segment, while a further part is located in the exit region of the segment. Accordingly, the one part is used primarily for the feed of the substrate in the entry region, while the other part is used for the feed in the exit region. If the segment comprises several treatment planes or treatment tracks, one or several individual feed devices can be provided for each of these treatment tracks. However, it is preferred to combine the parts of the feed devices as far as possible, which is always then easy to realize when synchronized treatment and transporting on parallel tracks is desired.

Alternatively, the above first embodiment comprises a single part feed device as separate structural component, which is preferably arranged, in respect of the length of the treatment plane of a segment, roughly in the center of the same. In order to guarantee a continuing contact of the catch(es) to the substrate edge, these are preferably designed telescopic. It is thus ensured that the catches can contact the substrate edge always at the height of the treatment plane.

According to the invention, each part of a multipart feed device comprises catches. Therein, according to the invention, only the catches are in direct contact with the substrate.

In the context of the above first and second embodiment, the feed device preferably has, as integral component of the lower or upper treatment surface, a multi-, and in particular, a two-part design, wherein each part comprises two catches which are arranged parallel to each other and, preferably, in a certain distance to each other. Also here, the one part is arranged rather at the entry, and the other part is arranged rather at the exit of the segment. The respective catches of the parts can be extended from the treatment surfaces, thus contacting the substrate edge, which preferably takes place in a synchronized manner. The catches can be retracted into the respective treatment surface after the intended feed has taken place.

In the context of the above-mentioned third embodiment, the feed device is designed as integral component of the lateral walls of a possibly present treatment chamber, and therefore two-part (on both sides). As explained before, the catches can be extended laterally from the respective wall so that they contact the substrate edge, which preferably also takes place in a synchronized manner.

According to the invention, it is preferred that the velocity of the feed which points in the respective feed direction can be adjusted in such a manner that, in cooperation with the flow velocity of the fluid cushion, this results in that the substrate is permanently pressed against the catch(es) of the feed device, thus avoiding that the substrate departs in an uncontrolled manner from the catch or the catches.

In case of the provision of an upper fluid cushion, depending on the concrete embodiment of the feed device, it can be preferably provided that the further surface which generates the upper fluid cushion provides gaps for the at least one catch. These gaps are functionally decoupled from the fluid emitting outlet openings and serve for the purpose that a catch which operates from above can, on its way in feed direction, always securely contact the edge of the substrate. In the case of the presence of a multi such as e.g. two-part feed device, the upper treatment surface would accordingly provide several such as e.g. two gaps.

The number of gaps in the treatment surface(s) usually corresponds to the number of parts of a feed device according to the invention, as well as to the respective number of catches of a part. The gaps run according to the movements which the catch(es) must perform, and, in the case of at least two catches per part, they are aligned substantially parallel to each other. According to the invention, the presence of only one catch per part is already sufficient, since the secure guiding and holding of an object is already achieved by the procedure as described above. According to a embodiment which is preferred in the case of more than one catch per part, the gaps for one respective part of a multi-, such as, in particular, a two-part feed device with at least two catches, are spaced apart from the other perpendicular to the transport direction, wherein, in the case of a two-part feed device, the respective distance is particularly preferred different in such a manner that a contacting of the catches of different parts is excluded. In particular, this is necessary if the substrate shall be handed over from the catches of a first part to the catches of a further part of a multi-, such as, in particular, a two-part feed device. Accordingly, the gaps for the catches of a multi-, such as, in particular, a two-part feed device, are arranged in the treatment surface(s) in such a manner that a contact of the catches of different, but cooperating parts is excluded.

Due to its catch arrangement, each part is thus suitable to contact the substrate preferably at its rear or in its back region located edge and to move it in feed direction. Particularly preferred, this contact engages symmetrically to the substrate; however, a feed can also be realized with an asymmetric application of force, provided that the rotation component which results from the asymmetry does not become so large that the positioning effect according to the invention is overrun. Therefore, from the substrate's viewpoint, a pushing force preferably acts on the same at any time, whereas from the viewpoint of the individual parts of a multipart feed device, a pulling motion is also possible, namely in particular if a part of the feed device being arranged in the region of the exit contacts a substrate at its rear which is still located in the middle of the segment. However, the forces acting onto the substrate are only compressive forces.

Particularly preferred, the catches are designed rod like and have ball or spherical segment like contact areas so that, as far as possible, between catch and substrate edge only a point or line contact, but not a surface contact, occurs. Furthermore, it is provided that the catches of a part are arranged at a common kinematics by which, in the course of the substrate contacting, the positioning of the contact areas with respect to the substrate edge is always securely adjustable during the treatment. In other words, the kinematics must be suitable for always properly adjusting the height of the contact areas with respect to the treatment plane. Preferably, link or joint motions which are known from the art can be used for this. This task can be solved particularly effectively with a parallelogram like kinematics. However, linear guides or robot guided devices are principally suitable for this purpose as well, but less preferred due to reasons of cost and complexity.

The description as set forth above was exemplarily based on the transport along a segment. It is clear that other longitudinal sections can be bridged with such a feed device as well. Particularly preferred, such a feed device is being used within treatment plants.

A further preferred embodiment provides that the objects are being transported within discrete sections or segments, wherein devices for the stopping or decelerating of the flat object are being arranged at the segment borders. For example, these sections can respectively be separated from the other by optionally closable devices such as e.g. closable discharge grooves, as lowerable overflow edges, or as lowerable and/or closable perforated strips. It might be provided that only the at least one treatment surface, or the at least one discharge region, or that both regions are dividable into individual segments with according segment borders.

Provided that the object shall pass several separated wet regions with different liquids that must be kept separate from each other, it can further also be provided that the mentioned segment borders are being formed by gaseous fluid. In this way, the flowing over of liquid medium from one segment to the next can be avoided, whereas the object to be transported can cross this medium weir on the liquid cushion. Preferably, these gaseous fluid cushions have a length in transport direction which is shorter than the substrate length, such that the guiding by means of the liquid remains ensured.

Accordingly, the aforementioned effect for holding or guiding can also be used for the controlled spacing of the objects to be transported. If, by reasons of efficiency, several substrates shall subsequently be conveyed in a lowest possible distance in one track through one or between several plants, it is important to ensure that the substrates do not collide with each other, thus causing damages one another.

This design can further be also used for a step-wise transport in order to enable stationary treatment times. For this, it is advantageous if the apparatus comprises according sensors which record the distance between substrates following each other and which feed the values to a suitable controller unit, which in turn controls the devices for stopping and/or the drive means of the feed device in a suitable manner.

According to this embodiment, influencing of the stream can for example take place by temporarily flooding the optionally present discharge grooves, e.g. by accordingly increasing the delivery volume, or by decreasing or closing the discharge opening of the according groove. In this way, the resistance for the substrate in transport direction disappears, and the transport good is being accelerated again.

Further, it is preferred that ultrasound in the kHz or megahertz region can be coupled via the treatment surface into the liquid. For this, the apparatus according to the invention optionally comprises according ultra- and/or megasonic transducers. These can be arranged such that the sound reaches the flat objects on a direct way, or they can be arranged such that an indirect irradiation of the flat objects takes place, for example by an excitation of the side walls of an optionally present liquid basin, or by means of reflection.

According to a further embodiment it is also provided according to the invention that the streaming liquid is provided not only below the flat object, but also above the same, so that the apparatus has a sandwich like design. Accordingly, the apparatus according to the invention has also two treatment surfaces, whereby it can be sufficient to only provide one discharge region due to gravity which is arranged at the bottom.

Finally, it is preferred that the apparatus further comprises at least one device for control of the flow, by means of which the flow velocity of the transport or treatment liquid, respectively, can be influenced by local and/or global change of the inflow volume and/or the inflow velocity and/or the outflow volume and/or the outflow velocity and/or the suction and/or the level of the liquid film.

The invention is explained in detail by means of the accompanying drawings.

OVERVIEW OF THE FIGURES

FIG. 1 shows a preferred embodiment of the treatment surface of the apparatus according to the invention in a top view.

FIGS. 2A-D show the apparatus according to the invention with embodiments of the feed device as provided according to the invention.

FIG. 3 shows the apparatus according to the invention with a still another embodiment of the feed device as provided according to the invention.

FIG. 4 shows the apparatus according to the invention with different embodiments of the feed device as provided according to the invention in a frontal view.

FIG. 5 shows two parallel running treatment surfaces of the apparatus according to the invention which are loaded with substrates in a perspective view.

FIG. 6 shows two parallel running treatment surfaces of the apparatus according to the invention which are loaded with substrates and which are single sided segmented in a perspective view.

FIG. 7 shows a further embodiment of two parallel running treatment surfaces of the apparatus according to the invention which are loaded with substrates in a perspective view.

FIG. 8 shows a top view (FIG. 8A) onto a preferred embodiment of the apparatus according to the invention, as well as its cut view (FIG. 8B).

The FIG. 9 shows a cut view of a further embodiment of the apparatus according to the invention.

The FIG. 10 shows a preferred embodiment of a device for stopping of the substrate.

FIGS. 11A and 11B show an overview for the situation in the border region of the treatment surface, or a detail of the same, respectively.

FIG. 12 shows the cut view of an embodiment of the apparatus according to the invention with two treatment surfaces 7 emitting liquid F, wherein one of them is arranged below, and a further is arranged above the substrate 1.

DESCRIPTION OF FIGURES

The FIG. 1 shows a preferred embodiment of the treatment surface of the apparatus according to the invention with bordering discharge regions in a top view. The treatment surface 7 comprises an inflow region 2 which is arranged centered on the treatment surface 7 in the depicted embodiment, and it is bordered by two discharge regions 3 arranged on both sides. The inflow region 2 comprises a multitude of pass-through openings 6, which are regularly arranged in the depicted embodiment. Further, small boreholes are depicted as inlets.

The FIG. 1 does also indicate that the apparatus according to the invention can be composed from individual segments which are respectively designed as depicted in the FIG. 1, and which can be arranged one after another. Therefore, an overlap region 8 is advantageously provided which is designed such that one end of the segment just overlaps the beginning of the next segment. For this, the overlap region is formed on one end as negative of the overlap of the other end.

FIG. 2A shows the feed device comprising drive means 4' which are designed as rolls and belts 15, and feed devices 4" in the form of catches are attached to the same which are designed as small plates. The small plates contact the substrates 1 only at the rear edge which faces away from the transport direction T. In FIG. 2B, the drive means 4' is designed as rolls and chains 16. In FIG. 2C, the drive means 4' is designed as a pump 18. In FIG. 2D, the drive means 4' is designed as a cylinder 17 and the feed devices 4" as pins 19.

Figure 3:
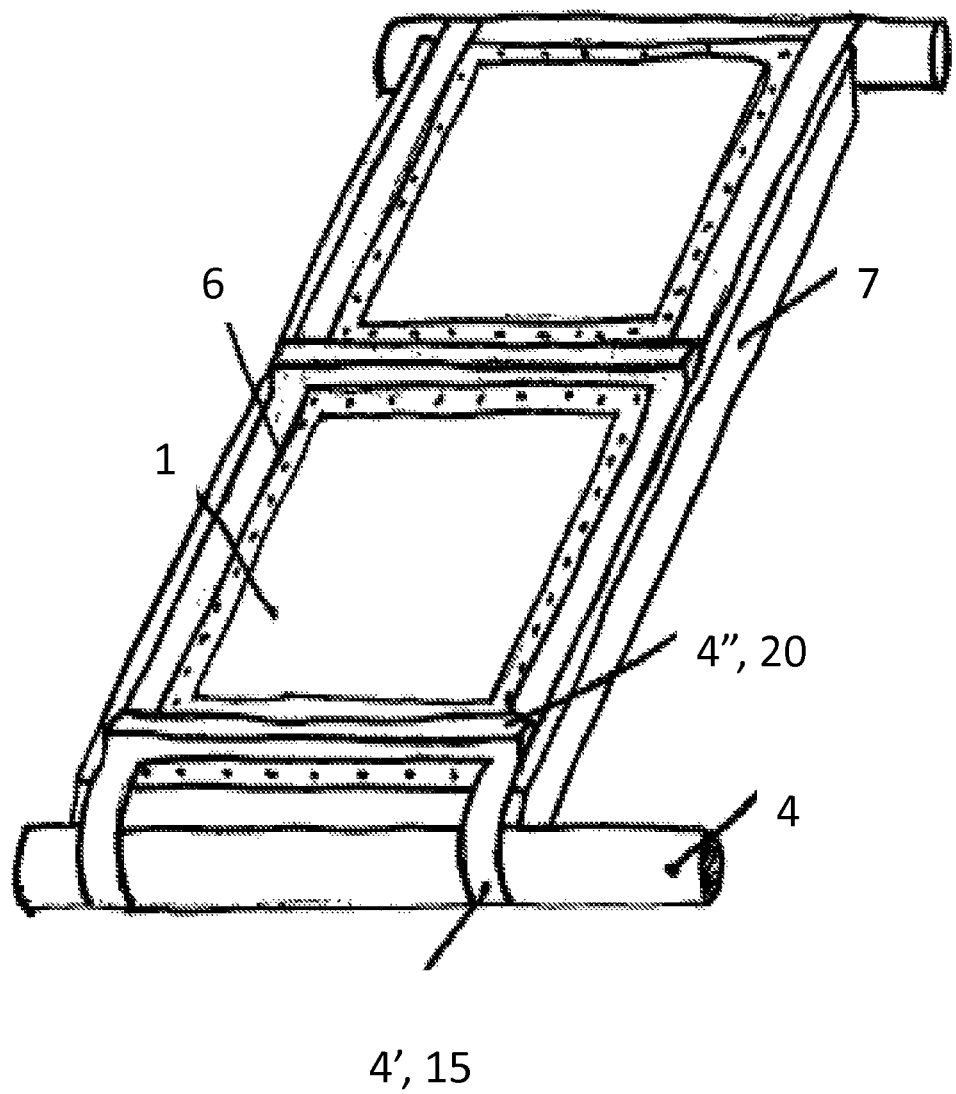

The FIG. 3 shows a another embodiment of the feed device 4 as provided according to the invention with scraper floor rails 20. The strip like catches are designed continuously, such that they contact the entire rear edge of the respective substrates 1. The underside of the strips scrapes on the treatment surface. The individual scraper floor rails 20 are spaced apart from each other and are respectively connected with according drive belts 15 on both sides.

Figure 4:
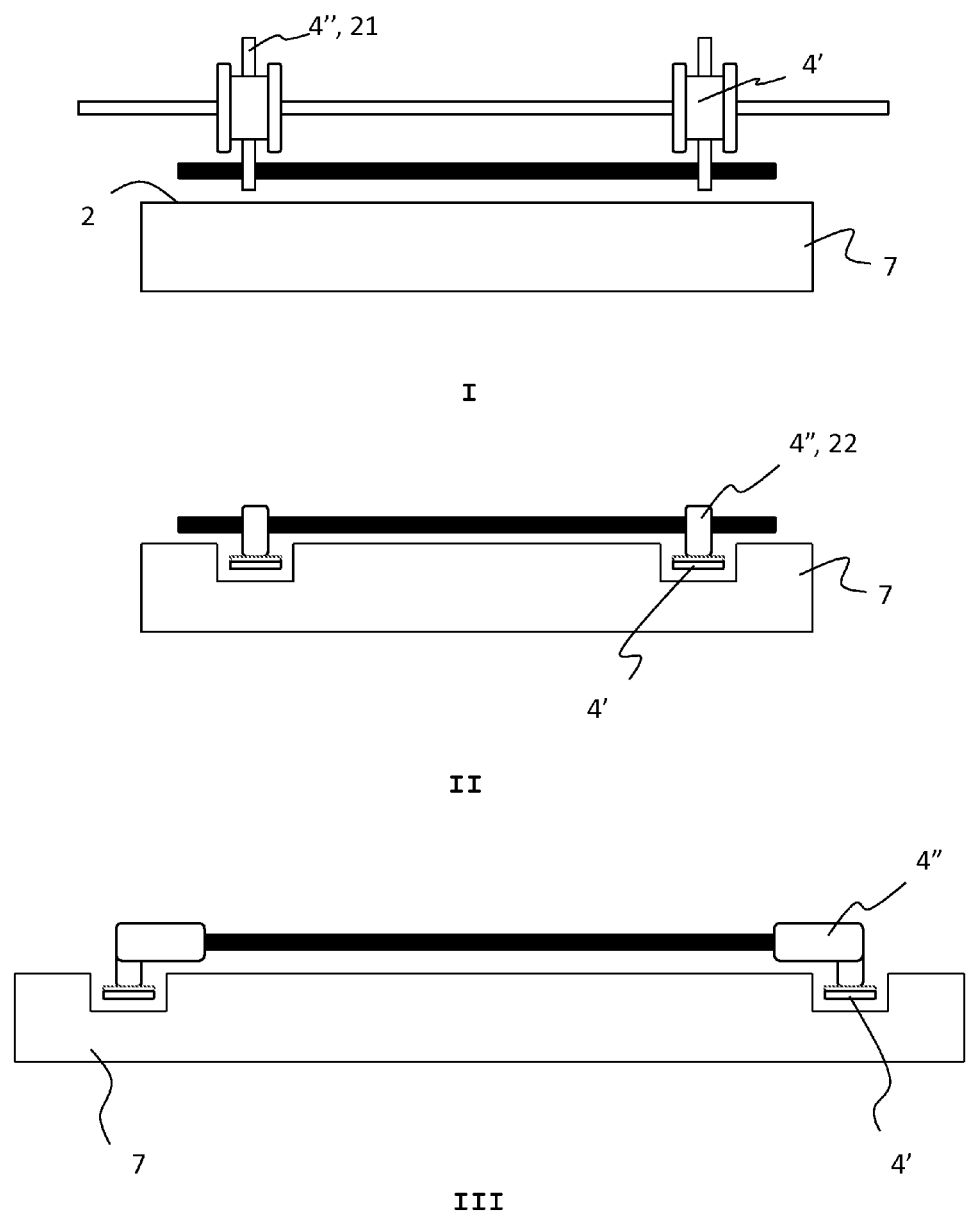

The FIG. 4 shows the apparatus according to the invention with different embodiments of the feed device as provided according to the invention in a respective frontal view.

The representation which is indicated by "I" shows feed devices 4" which are arranged above inflow region 2 and substrate 1. In particular, the feed devices 4" are in the form of ribs 21. Accordingly, the rib-shaped catches point downwards where they contact the rear edge of the substrate 1 and apply a feed force V onto the same which points into the drawing plane in the representation.

The representation which is indicated by "II" shows feed devices 4" which are arranged below the substrate 1. In the depicted representation, the drive means 4' run in recesses which draw through the inflow region along the transport direction T. The feed means 4" depicted as end stops 21 are attached to drive means 4' in such a manner that they extend upwards into the transport region of the substrate and contact its rear edge there.

In the representation which is indicated by "III", the feed devices 4" which are designed as catches are designed angled, so that they contact the rear corners and part of the rear edge of the respective substrate 1.

Figure 5:
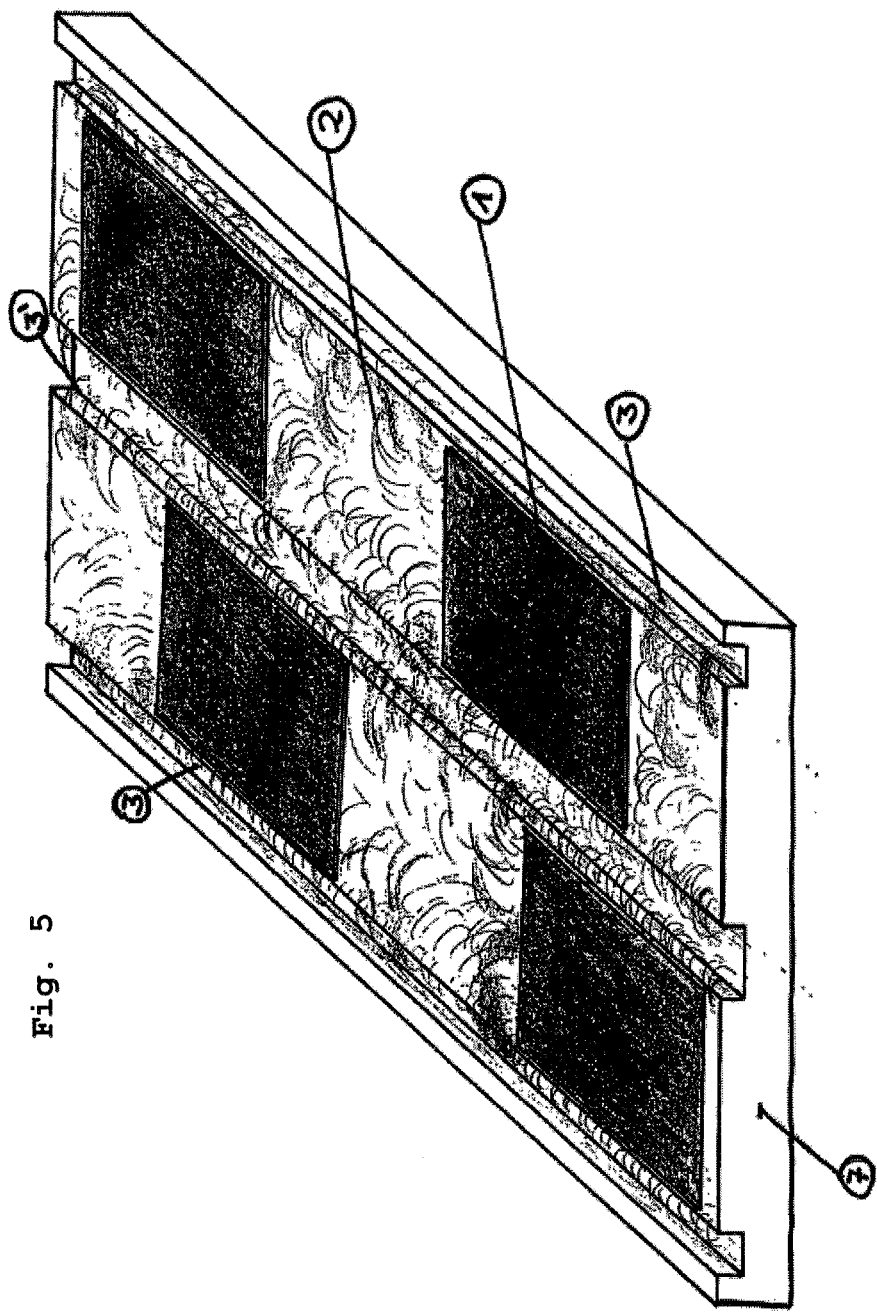

FIG. 5 shows two parallel running treatment surfaces 7 of the apparatus according to the invention which are loaded with substrates 1 in a perspective view. The liquid waves shown in the figure indicate the liquid F which is present on the inflow region 2 and which discharges into the discharge region 3, and more precisely, into several discharge grooves 3'. Advantageously, the centrally arranged discharge groove 3' serves as discharge groove for both treatment surfaces 7 at the same time. Boreholes that discharge the liquid from the discharge grooves which is collected in them are not depicted.

Figure 6:
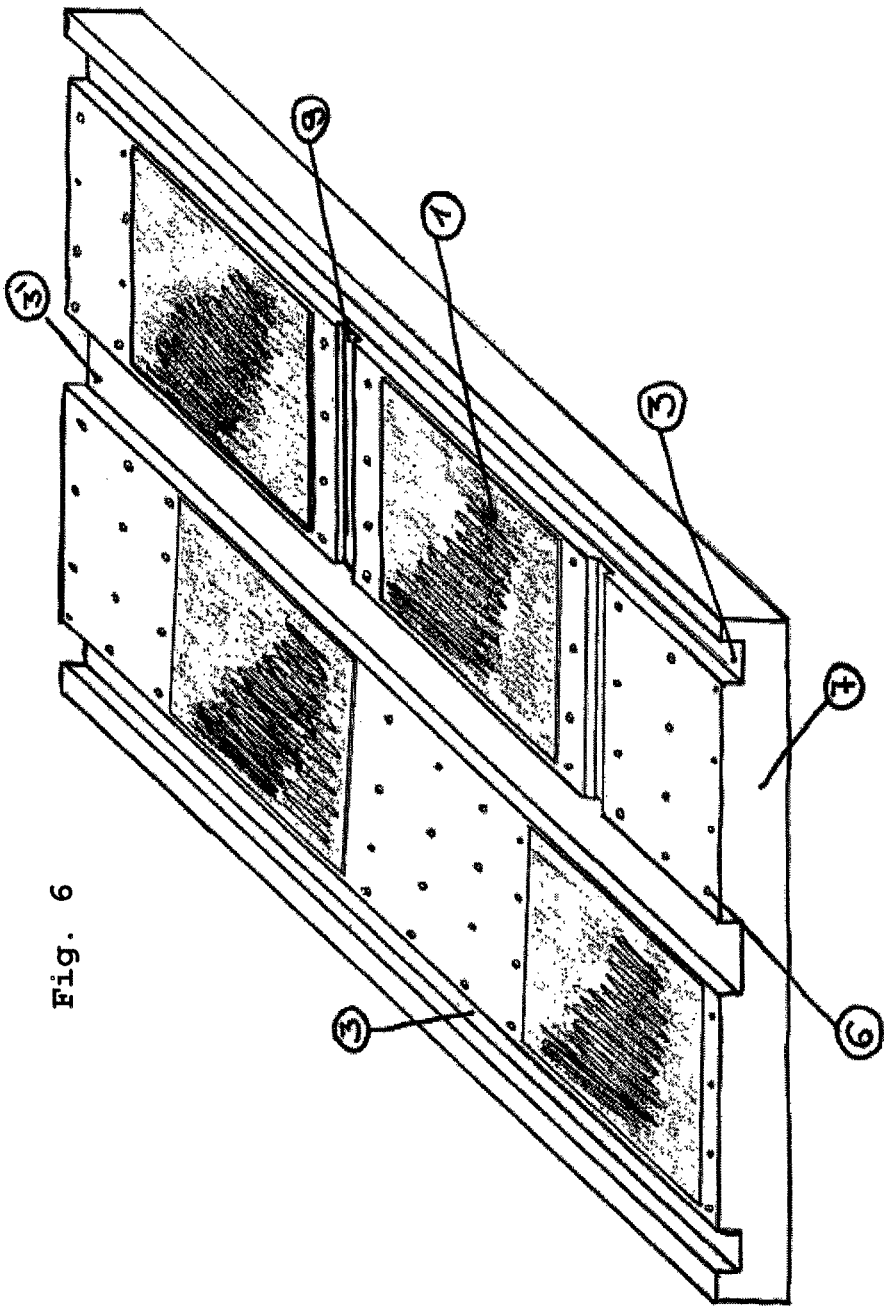

In FIG. 6, two parallel running treatment surfaces 7 of the apparatus according to the invention which are loaded with substrates and which are single sided segmented are shown in a perspective view. The segments of the treatment surface shown at the right hand side are separated from each other by segment borders 9. These segment borders 9 are designed as discharge grooves 3' according to the depicted embodiment. Provided that the amount of liquid F (not depicted) which streams out from the pass-through openings 6 is too small, the substrates 1 cannot surmount the segment borders 9. As soon as the amount of liquid is accordingly increased, thus raising the liquid level, the substrates 1 can pass the segment borders 9. Alternatively, the segment borders can have closeable discharge openings which let, when being closed, fill up the discharge grooves 3', such that the substrates 1 can pass the segment borders 9.

Figure 1:
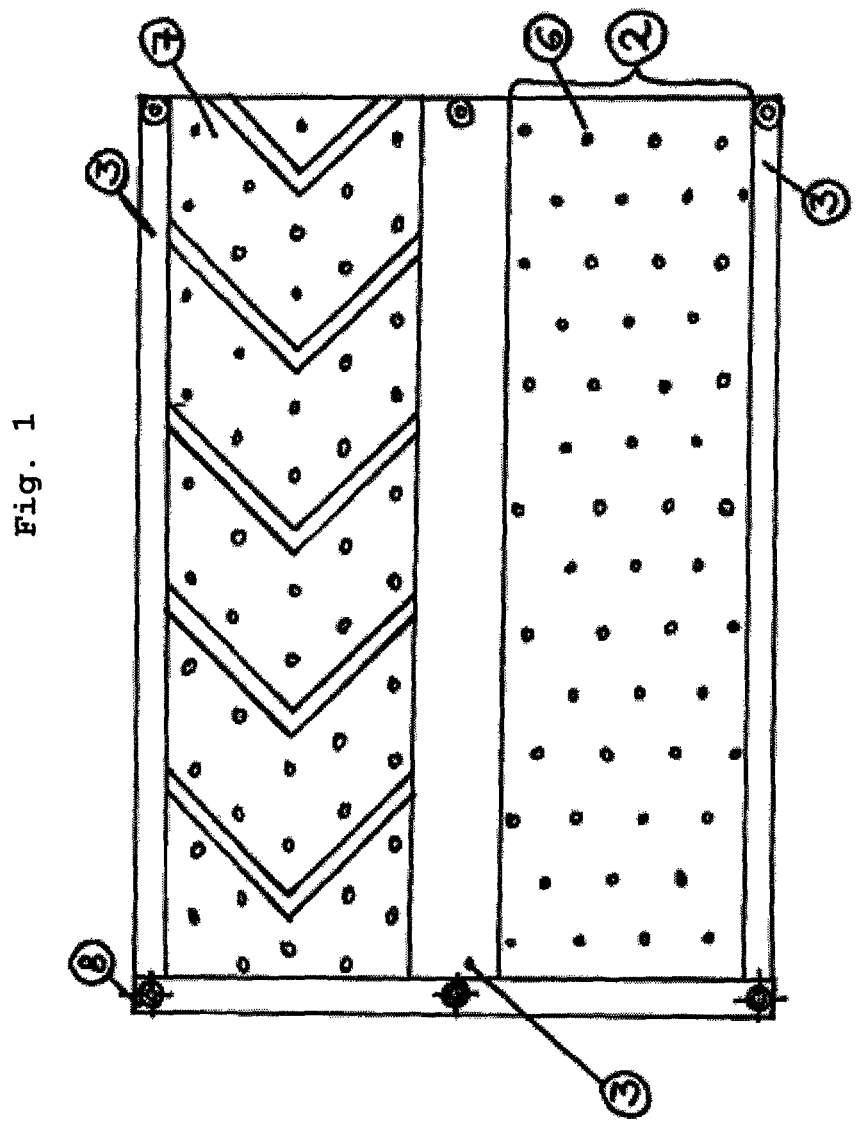
Figure 2A:
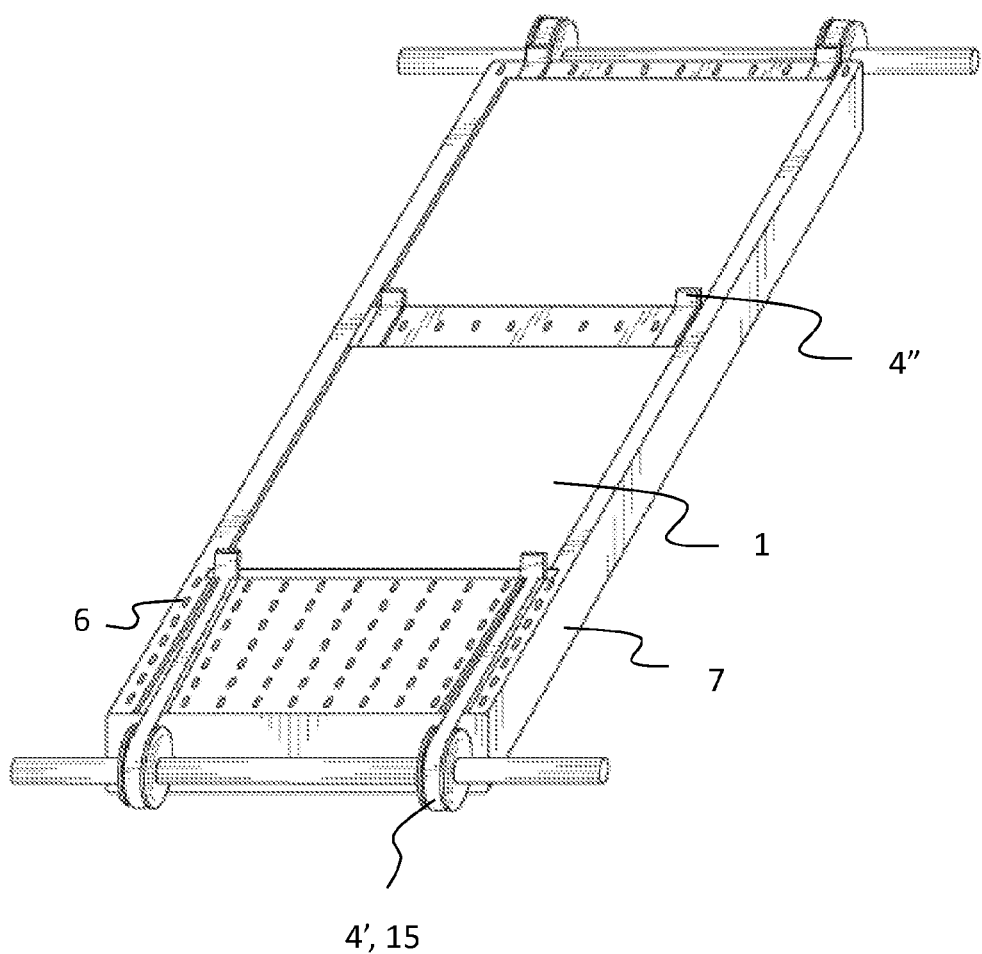
In FIGS. 2A-D, embodiments of the apparatus according to the invention is shown according to which it comprises variations of the feed device 4 as provided according to the invention.
Figure 2B:
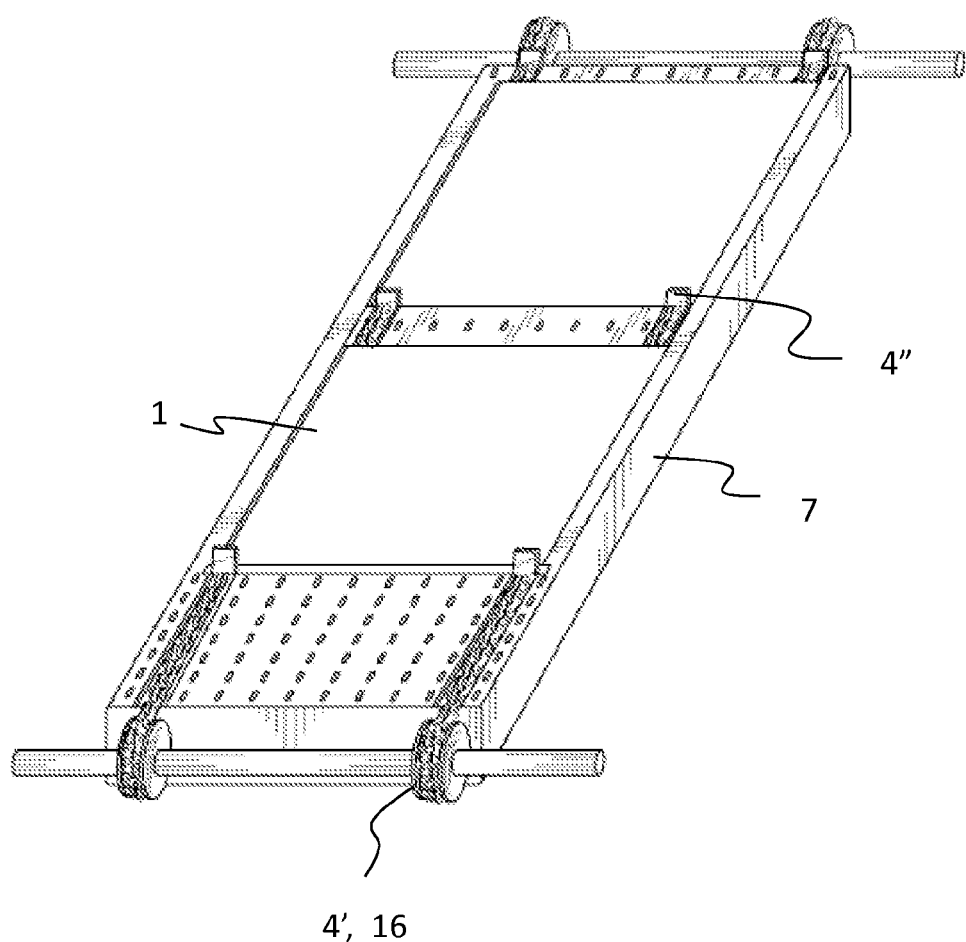
Figure 2C:
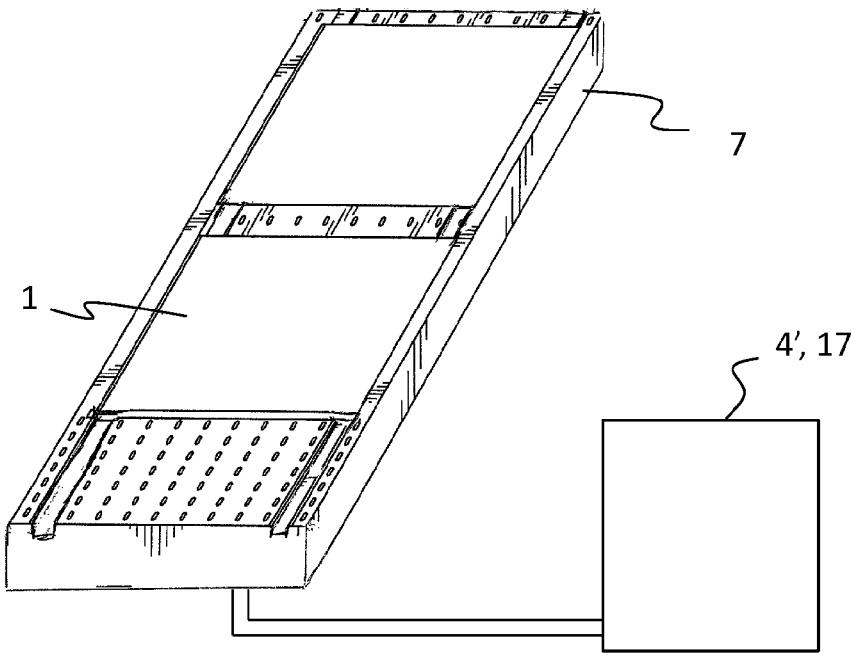
Figure 2D:
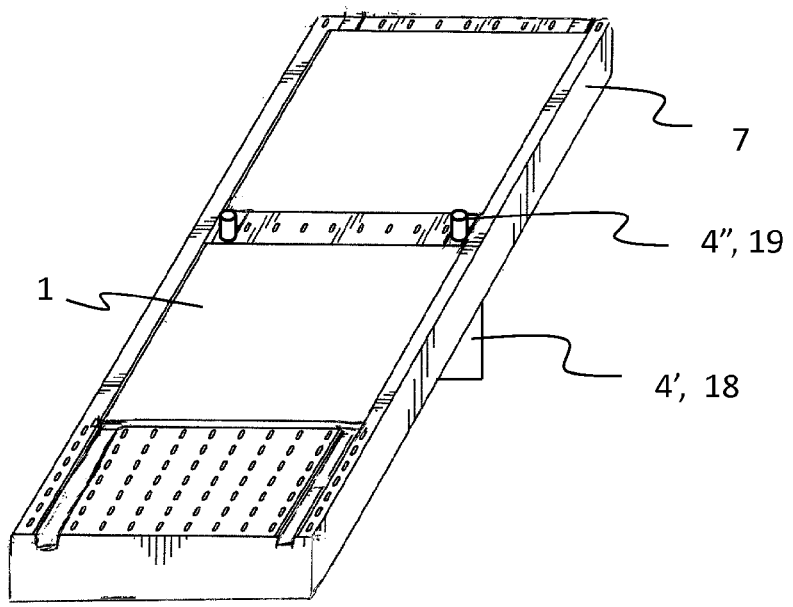

The FIG. 7 shows a further embodiment of two parallel running treatment surfaces 7 of the apparatus according to the invention which are loaded with substrates 1 in a perspective view. The embodiment which is depicted here largely corresponds to the embodiment which is shown in the FIG. 1 as a top view, wherein the treatment surface which is arranged left hand in the picture represents the preferred embodiment with V-shaped slots.

The FIG. 8 shows a top view (FIG. 8A) onto a preferred embodiment of the apparatus according to the invention with a substrate 1. Several rows of pass-through openings 6 are present on the treatment surface 7 which are connected with a not shown feed and discharge system being arranged below.

A cut line whose associated side view is shown in the FIG. 8B is also depicted. Well visible are the angled pass-through openings 6 which are inclined partially in the transport direction T, pointing to the right, and partially contrary to the same. It is visible as well that also on the very same row of pass-through openings 6, i.e. in a respectively identical distance to the side of the treatment surface 7, different inclinations are provided. Accordingly, these pass-through openings 6 can optionally be used for accelerating or decelerating the substrate, provided that they are controllable in groups. It is further provided that, if desired and depending on the direction of the inclination, the apparatus as a whole can be tilted to an angle of 10° in order to exert an additional acceleration or deceleration force onto the substrate.

Figure 9:
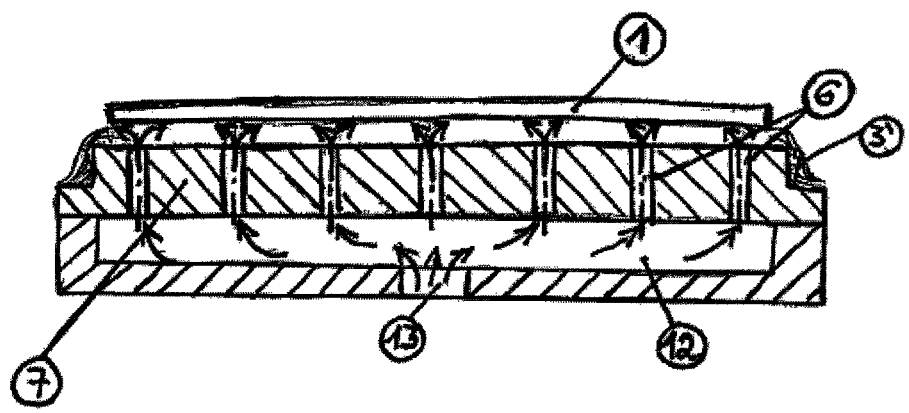

The FIG. 9 shows a cut view through the apparatus according to the invention along a plane which stands perpendicular to the transport direction T. The substrate 1 is deposited on the treatment surface 7. Liquid F leaves through pass-through openings 6 onto the treatment surface 7 and forms a liquid film which carries the substrate 1. A cavity 12 with an inlet 13 is present below the pass-through openings 6, with the inlet feeding the individual pass-through openings 6 with liquid. The latter laterally leaves the treatment surface 7 into according discharge grooves 3'.

Figure 10:
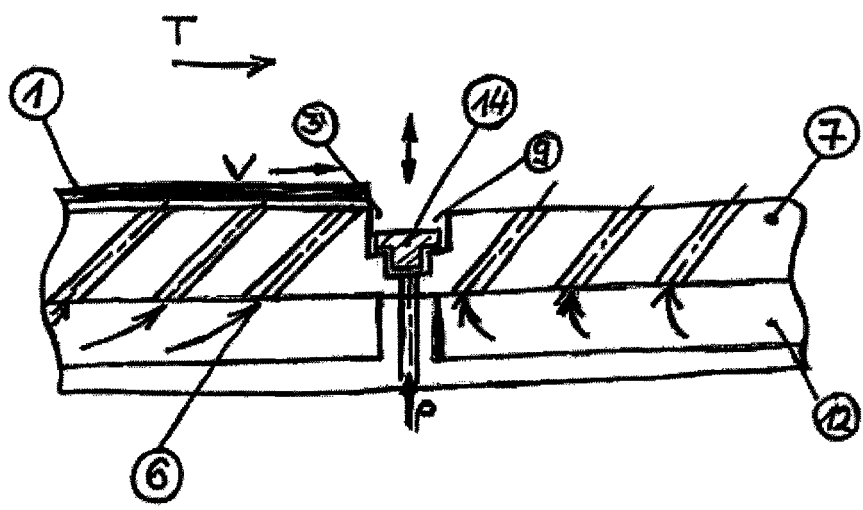

In the FIG. 10, a preferred embodiment of a device for stopping of the substrate is shown. The figure is depicted as a further cut view which now runs along a plane that stands parallel to the transport direction T and perpendicular to the surface of the treatment surface 7. In the left part of the picture, furthermore, a substrate 1 is shown which stands in direct proximity to a segment border 9 of two segments following each other. Liquid which streams through the cavity 12 into the pass-through openings 6 and further onto the treatment surface 7 exerts a feed force V onto the substrate due to the pass-through openings 6 which are inclined in transport direction T. However, a recess in the form of a discharge groove 3' into which the liquid preferably discharges is present at the segment border 9 so that the substrate 1 does not pass this recess. If, however, the vertically movable strip 14 is raised up to the level of the treatment surface 7, e.g. by means of an overpressure on the underside of the strip 14, the discharge groove 3' is closed, and the substrate 1 can pass.

Figure 11:
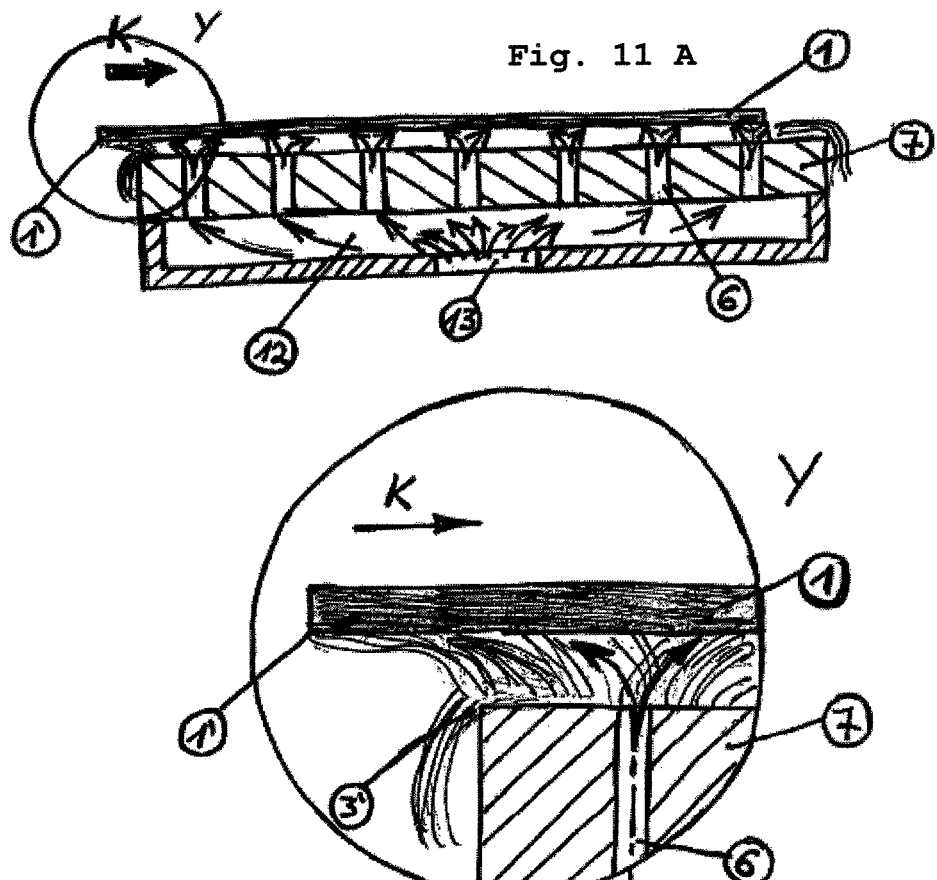

The FIGS. 11A and 11B show an overview for the situation in the border region of the treatment surface, or a detail Y of the same, respectively. A substrate 1 is respectively shown which is located on the treatment surface 7 and which is positioned such that it slightly extends over the border of the treatment surface 7 and into the region of the discharge groove 3'. The substrate in turn is being lifted by the liquid which streams against it from below. In the border region, the liquid mainly streams into the discharge groove 3', but it also further wets the underside of the substrate 1. The surface tension of this thin liquid film wetting the underside tends to reduce the free surface in order to reach an energetically more favorable state. As long as the substrate edge 1' does not extend too far over the border of the treatment surface 7, said liquid film reaches up to the substrate edge 1' which it however cannot pass in direction of the upper side of the substrate 1. Due to the capillary effect which forms at this usually sharp edge and which fixes the border of the liquid film to the edge of the substrate, the liquid film can reduce its surface only by pulling the substrate 1 in direction of the treatment surface 7 (guiding force K), thus causing the effect of the auto-positioning as desired according to the invention.

In the case of a transport with treatment liquid, an exclusively single sided treatment of the substrate is achievable if the geometry and flow parameters are correctly adjusted, wherein the edges are being wetted as well, if desired.

Figure 12:
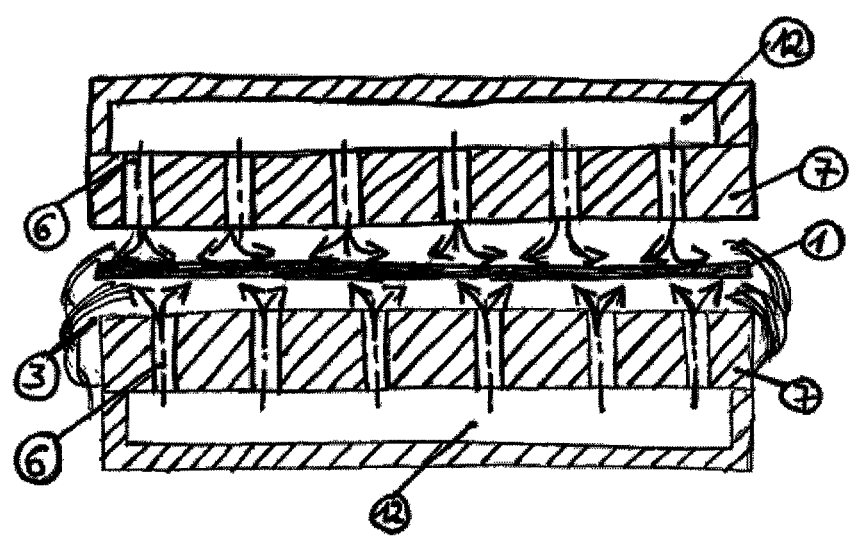

In the FIG. 12, the cut view of an embodiment of the apparatus according to the invention with two treatment surfaces 7 emitting liquid F is shown, wherein one of them is arranged below, and a further is arranged above the substrate 1. Again, the pass-through openings 6 are being collectively fed with liquid F by according cavities 12 which streams against both sides of the substrate 1, so that the same is now being held on both sides. Adjacent to the treatment surface 7, discharge regions 3 which are arranged on both sides are present into which the liquid can discharge after leaving the transport gap.

The invention enables the holding and guiding of essentially flat objects by the exclusive use of a preferably streaming liquid, i.e. without the aid of mechanically acting, non-fluidic lateral edges, limiters, or other mechanical guiding aids for holding or guiding the objects. In this way, a mechanical damage of not only the flat sides, but in particular of the lateral circumferential edges of the flat objects can be reliably avoided. Furthermore, the invention allows a simultaneous, e.g. wet chemical treatment of the objects during the transporting. For the feed, the invention preferably also allows the provision of a feed force by means of the streaming liquid. Alternatively, in particular with regard to treatment durations that must precisely be maintained, a feed device can be provided which serves for maintaining precise treatment durations in particular in case of a simultaneous treatment of the objects. The invention further allows to not only move the substrates in transport direction, but also to stop them temporarily, whereby the substrates do not or only insignificantly come in mechanically acting contact with the environment such as for example with mechanical stoppers.

LIST OF REFERENCES AND ABBREVIATIONS 1 substrate, flat object
1' substrate edge
2 inflow region
3 discharge region
3' discharge groove
4 feed device
4' drive means
4" feed means
5 ultra-/megasonic treatment
6 pass-through openings
7 treatment surface
8 overlap region
9 segment border
10 angle
11 nozzle boreholes
12 cavity
13 inlet
14 strip
15 belt
16 chain
17 cylinder
18 pump
19 pin
20 floor rail
21 rib
F transport or treatment liquid, liquid
V feed force
K guiding force
T transport direction

The invention claimed is:

1. Apparatus for the transporting of a substantially flat and freely moveable object (1) on a liquid, comprising
   at least one treatment surface with at least one inflow region (2) with a multitude of pass-through openings (6) out of which the flat object (1) can be streamed against by a liquid (F), and
   at least one discharge region (3) laterally adjoining the treatment surface for discharging the liquid (F) after provision of the inflow,
wherein the apparatus does not comprise any non-fluidic edges, limiters, or other mechanical guiding aids for holding and guiding the flat object (1), and wherein the treatment surface and the discharge region are designed such that an adhesion force that self-centers the object can be generated between the flat object (1) and the boundary between treatment surface and discharge region, by which the flat object (1) can be held and guided exclusively by the stream of liquid (F).

2. Apparatus according to claim 1, wherein the inflow region (2) is formed as part of a flat treatment surface (7).

3. Apparatus according to claim 1, wherein the treatment surface (7) is formed stationary.

4. Apparatus according to claim 1, wherein the treatment surface (7) is not more than 4 mm and preferably not more than 3 mm wider than the flat object (1).

5. Apparatus according to claim 1, wherein the discharge region (3) consists of boreholes or is formed as a discharge groove, as a perforated strip, or as a lattice of openings.

6. Apparatus according to claim 1, wherein the apparatus is configured for active suction of liquid (F) from the discharging region (3).

7. Apparatus according to claim 1, further comprising means for the generation of a feed force (V) which acts onto the flat object (1).

8. Apparatus according to claim 7, wherein the feed force (V) is being provided by the inclined pass-through openings (6) of the inflow region (2) of the treatment surface (7).

9. Apparatus according to claim 8, wherein the pass-through openings (6) are designed changeable in their inclination and/or in their cross section.

10. Apparatus according to claim 7, wherein the feed force (V) is additionally or exclusively being provided by a mechanically acting feed device (4).

11. Apparatus according to claim 10, wherein the feed device (4) comprises a drive means (4') which is selected from the group consisting of drive belts, link chains, pneumatic cylinders, and fluid pumps, and at least one feed means (4") which is selected from the group consisting of mechanical end stops, ribs, pins, and scraper floor rails, wherein optionally, the feed means (4") respectively acts only onto the flat object's (1) edge which stands perpendicular to the transport direction (T).

12. Apparatus according to claim 10, wherein the feed device (4) is designed in such a manner that it is drivable in transport direction (T) and optionally additionally stoppable.

13. Apparatus according to claim 1, wherein the at least one treatment surface (7) and/or the at least one discharge region (3) can be separated into individual segments with segment borders (9), wherein devices for stopping the flat object (1) are arranged at the segment borders (9), optionally wherein the devices for stopping are designed as closable discharge grooves, as lowerable overflow edges, or as lowerable and/or closable perforated strips.

14. Apparatus according to claim 1, wherein additionally, at least one treatment surface (7) is additionally arranged above the flat object (1).

15. Apparatus according to claim 1, wherein at least some of the the pass through openings stream liquid.

\* \* \* \* \*